(12) United States Patent
Chen et al.

(10) Patent No.: US 7,859,887 B2
(45) Date of Patent: Dec. 28, 2010

(54) MULTILEVEL NONVOLATILE MEMORY DEVICE CONTAINING A CARBON STORAGE MATERIAL AND METHODS OF MAKING AND USING SAME

(75) Inventors: Xiying Chen, San Jose, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 337 days.

(21) Appl. No.: 12/153,873

(22) Filed: May 27, 2008

(65) Prior Publication Data

US 2009/0257266 A1    Oct. 15, 2009

Related U.S. Application Data

(60) Provisional application No. 61/071,090, filed on Apr. 11, 2008.

(51) Int. Cl.
  *G11C 11/00* (2006.01)
(52) U.S. Cl. .................. 365/148; 365/100; 365/163; 365/175
(58) Field of Classification Search ................. 365/148, 365/100, 163, 175, 185.19, 185.22, 185.18; 977/742, 734, 842
See application file for complete search history.

(56) References Cited

U.S. PATENT DOCUMENTS

| | | | |
|---|---|---|---|
| 5,915,167 | A | 6/1999 | Leedy |
| 6,055,180 | A | 4/2000 | Gudesen et al. |
| 6,548,313 | B1 | 4/2003 | Ravi et al. |
| 6,574,130 | B2 | 6/2003 | Segal et al. |
| 6,686,646 | B2 | 2/2004 | Lee |
| 6,706,402 | B2 | 3/2004 | Rueckes et al. |
| 6,815,704 | B1 | 11/2004 | Chen |
| 7,081,377 | B2 | 7/2006 | Cleeves |
| 7,113,426 | B2 | 9/2006 | Rueckes et al. |
| 7,176,064 | B2 | 2/2007 | Herner |
| 7,345,907 | B2 | 3/2008 | Scheuerlein |
| 7,397,701 | B2 * | 7/2008 | Yeh et al. ............. 365/185.18 |
| 7,480,174 | B2 * | 1/2009 | Lee et al. ................. 365/163 |
| 7,492,630 | B2 | 2/2009 | Scheuerlein et al. |
| 7,522,448 | B2 * | 4/2009 | Scheuerlein et al. ....... 365/163 |

(Continued)

FOREIGN PATENT DOCUMENTS

EP    1 780 814 A2    5/2007

(Continued)

OTHER PUBLICATIONS

Office Action dated Jan. 12, 2010 received for U.S. Appl. No. 12/153,872.

(Continued)

*Primary Examiner*—Anh Phung
*Assistant Examiner*—Hien N Nguyen
(74) *Attorney, Agent, or Firm*—The Marbury Law Group PLLC

(57) ABSTRACT

A method of programming a nonvolatile memory cell includes applying at least one initialization pulse having a duration of at least 1 ms, followed by applying plural programming pulses having a duration of less than 1 ms. The cell includes a steering element located in series with a storage element, and the storage element includes a carbon material.

13 Claims, 31 Drawing Sheets

U.S. PATENT DOCUMENTS

| | | | |
|---|---|---|---|
| 2004/0033189 | A1 | 2/2004 | Kaschak et al. |
| 2005/0012119 | A1 | 1/2005 | Herner et al. |
| 2005/0226067 | A1 | 10/2005 | Herner et al. |
| 2006/0087005 | A1 | 4/2006 | Herner |
| 2006/0108667 | A1 | 5/2006 | Lung |
| 2006/0141679 | A1 | 6/2006 | Subramanian et al. |
| 2006/0250836 | A1 | 11/2006 | Herner et al. |
| 2006/0250837 | A1 | 11/2006 | Herner et al. |
| 2007/0008773 | A1 | 1/2007 | Scheuerlein |
| 2007/0029546 | A1 | 2/2007 | Cho et al. |
| 2007/0070690 | A1 | 3/2007 | Scheuerlein et al. |
| 2007/0090425 | A1* | 4/2007 | Kumar et al. ............... 257/295 |
| 2007/0284656 | A1 | 12/2007 | Radigan et al. |
| 2008/0128853 | A1 | 6/2008 | Choi et al. |
| 2008/0237599 | A1 | 10/2008 | Herner et al. |
| 2008/0239790 | A1 | 10/2008 | Herner et al. |
| 2009/0168492 | A1 | 7/2009 | Thorp et al. |

FOREIGN PATENT DOCUMENTS

| | | |
|---|---|---|
| EP | 1 816 680 A1 | 8/2007 |
| EP | 2 043 156 A2 | 4/2009 |

OTHER PUBLICATIONS

Office Action dated Jan. 22, 2010 received for U.S. Appl. No. 12/216,110.

Notice of Allowance dated Feb. 17, 2010 received for U.S. Appl. No. 12/153,874.

A. M. Rao et al., In situ-grown carbon nanotube array with excellent field emission characteristics, Applied Physics Letters, (2000), pp. 3813-3815, vol. 76, No. 25.

Tomohiro Nozaki et al., Fabrication of vertically aligned single-walled carbon nanotubes in atmospheric pressure non-thermal plasma CVD, Carbon, (2007), pp. 364-374, vol. 45.

E. Salonen et al., Ion-irradiation-induced defects in bundles of carbon nanotubes, Nuclear Instruments and Methods in Physics Research B, (2002), pp. 603-608, vol. 193.

Jun Li et al., Bottom-up approach for carbon nanotube interconnects, Applied Physics Letters, (2003), pp. 2491-2493, vol. 82, No. 15.

Hua-Chiang Wen et al., Effects of ammonia plasma treatment on the surface characteristics of carbon fibers, Surface & Coatings Technology, (2006), pp. 3166-3169, vol. 200.

M Meyyappan et al., Carbon nanotube growth by PECVD: a review, Plasma Sources Sci. Technol., (2003), pp. 205-216, vol. 12.

Y. Abdi et al., PECVD-grown carbon nanotubes on silicon substrates with a nickel-seeded tip-growth structure, Materials Science and Engineering C, (2006), pp. 1219-1223, vol. 26.

J. B. Cui et al., Carbon nanotube memory devices of high charge storage stability, Applied Physics Letters, (2002), pp. 3260-3262, vol. 81, No. 17.

Young Min Shin et al., Influence of morphology of catalyst thin film on vertically aligned carbon nanotube growth, Journal of Crystal Growth, (2004), pp. 81-89, vol. 271.

P. Smith et al., Polishing TiN for Nanotube Synthesis, Proceedings of the 16th Annual Meeting of the American Society for Precision Engineering, (2001), Crystal City, VA.

U.S. Appl. No. 12/007,780, filed Jan. 15, 2008, Herner et al.

U.S. Appl. No. 12/007,781, filed Jan. 15, 2008, Dunton et al.

U.S. Appl. No. 09/560,626, filed Apr. 28, 2000, Knall.

International Search Report and Written Opinion mailed Jul. 30, 2009, received in International Application No. PCT/US2009/039126.

International Search Report and Written Opinion mailed Aug. 10, 2009, received in International Application No. PCT/US2009/039127.

International Search Report and Written Opinion mailed Aug. 11, 2009, received in International Application No. PCT/US2009/039120.

Office Action mailed Oct. 29, 2009, received in U.S. Appl. No. 12/153,874.

Lemme et al., "Mobility in Graphene Double Gate Field Effect Transistors," Solid State Electronics, vol. 52, No. 4, 2008, pp. 514-518.

Li et al., "Processable Aqueous Dispersions of Graphene Nanosheets," Nature Nanotechnology, vol. 3, No. 2, 2008, pp. 101-105.

\* cited by examiner

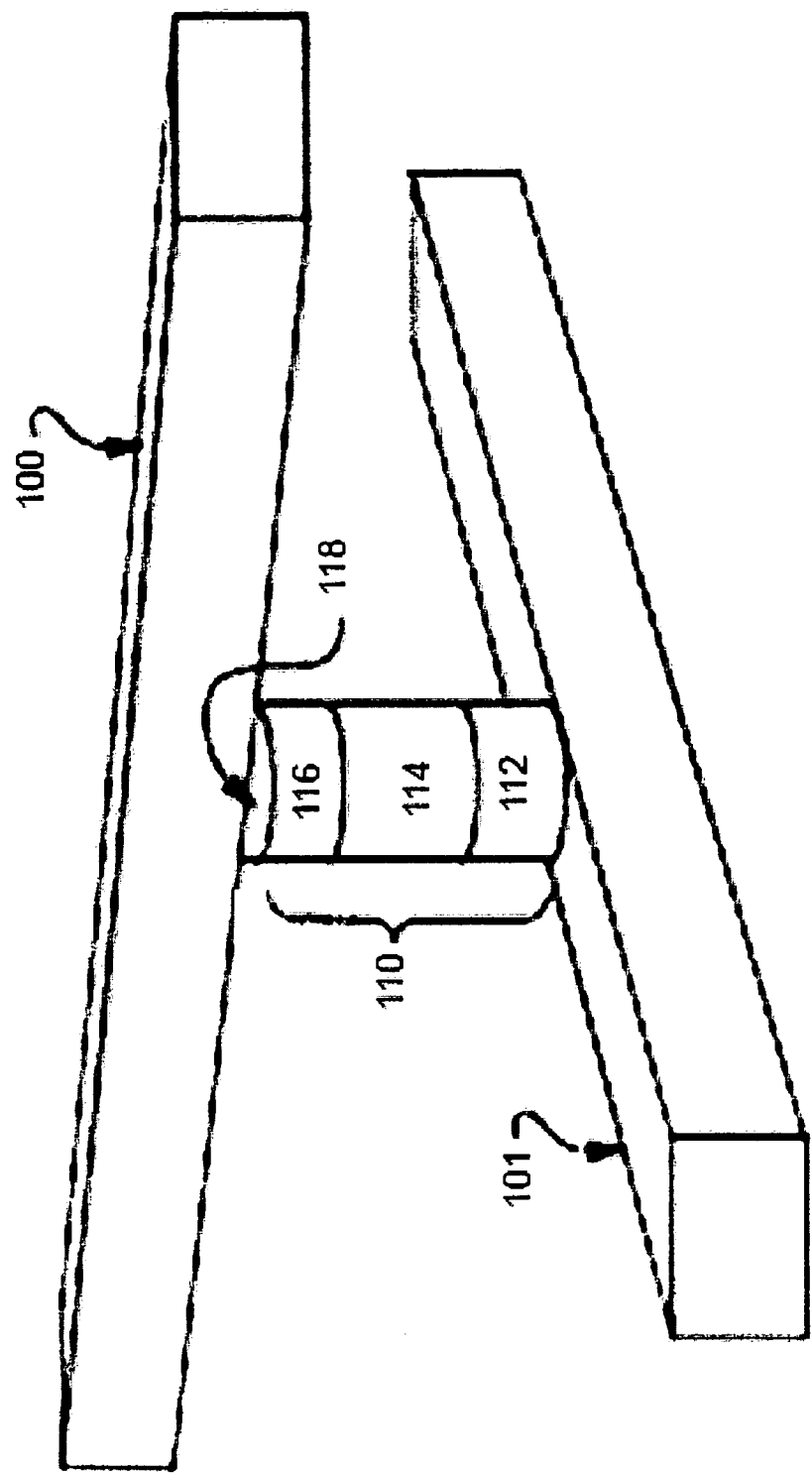

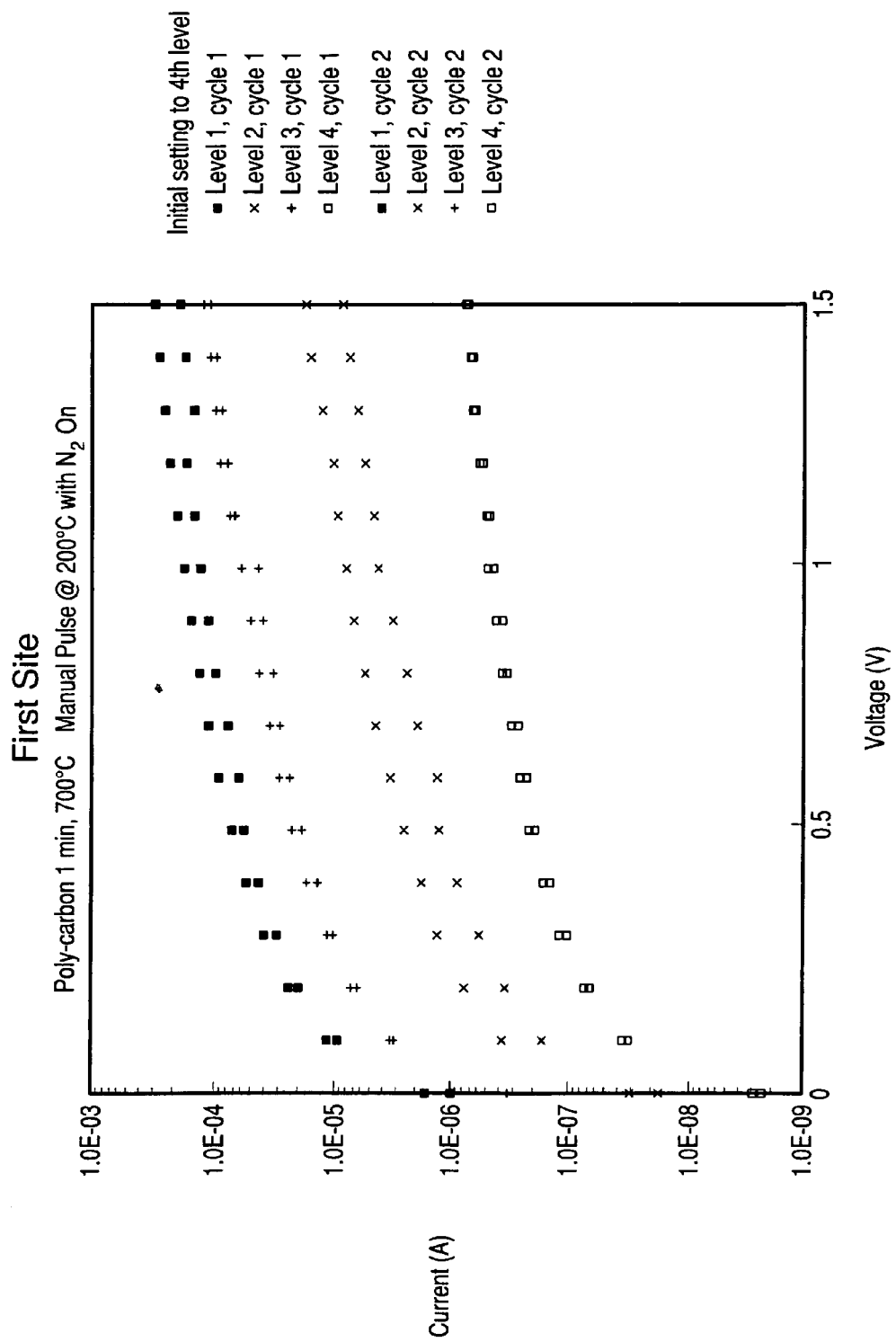

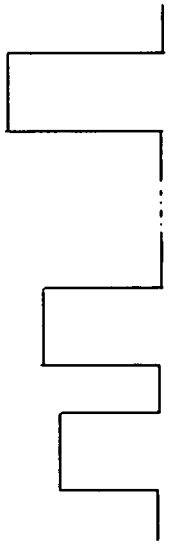
Fig. 7E
Set: ~ voltage
100nS; 1uS; 10uS; 100uS; 1mS; 10mS; 100mS
Reset: ~ voltage
100nS; 1uS; 10uS; 100uS; 1mS; 10mS; 100mS
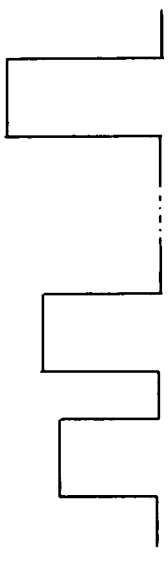
Fig. 7F
Set: ~ < mSec
5V; 6V; 7V; 8V; 9V; 10V; 11V; 12V
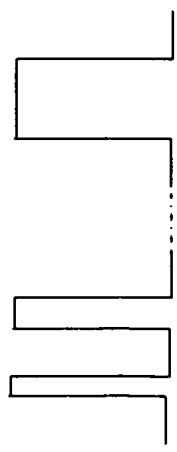
Reset: ~ < mSec
12V; 13V; 14V; 15V; 16V; 17; 18V; 19V; 20V

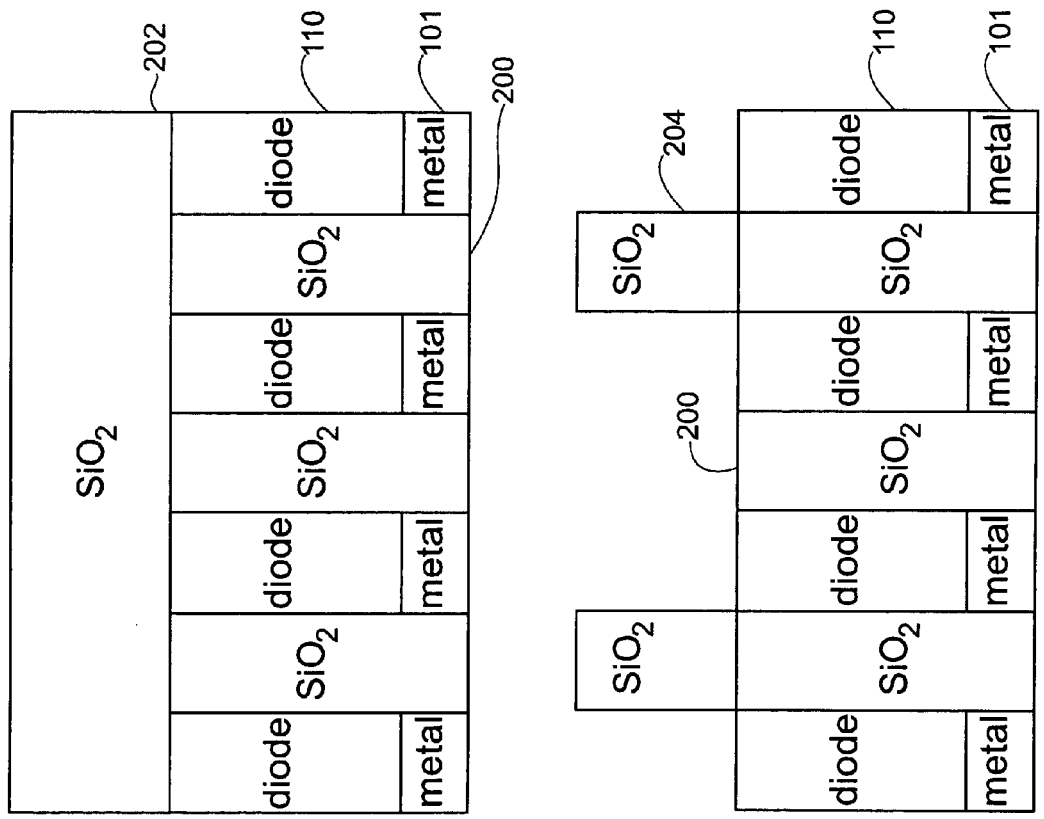

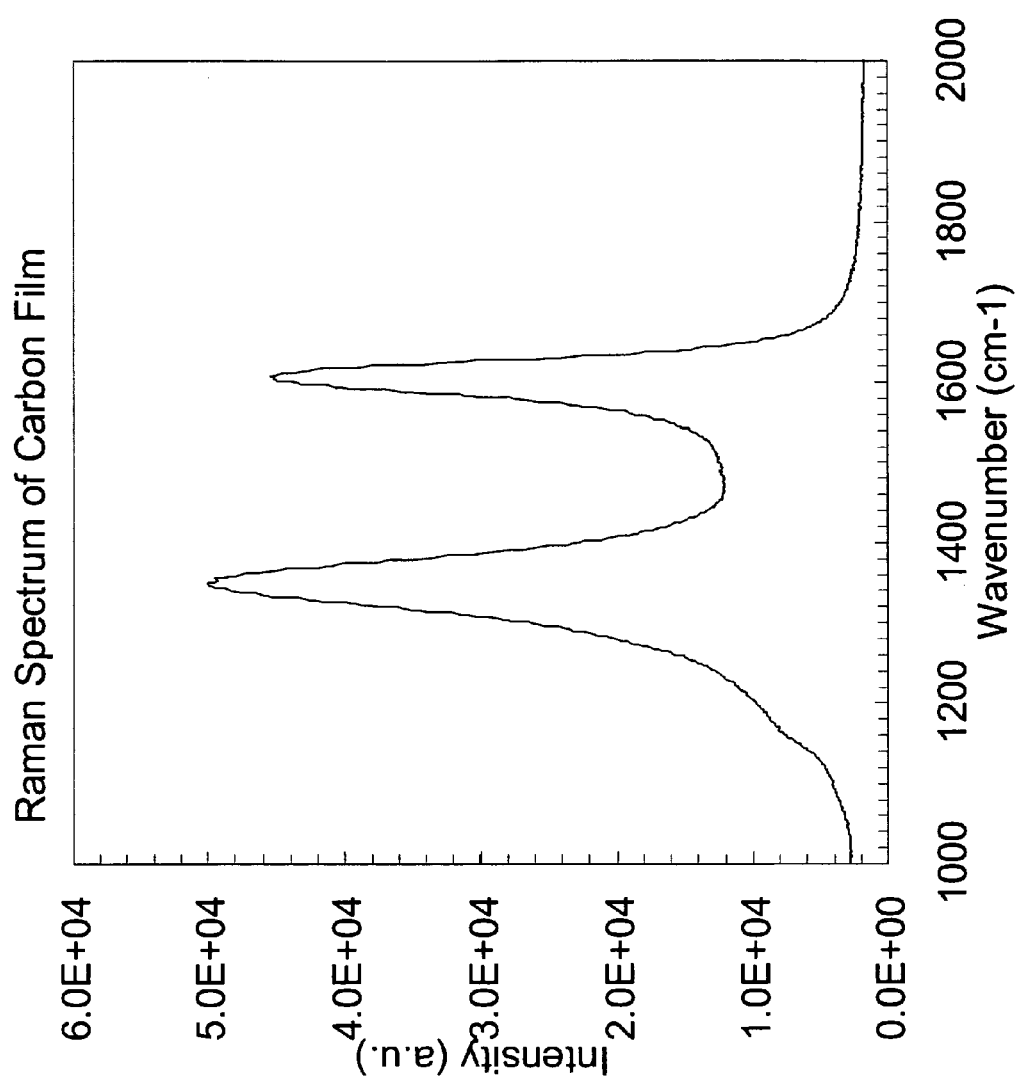
Fig. 9 Raman Spectrum of Carbon Film

MULTILEVEL NONVOLATILE MEMORY DEVICE CONTAINING A CARBON STORAGE MATERIAL AND METHODS OF MAKING AND USING SAME

BACKGROUND OF THE INVENTION

The invention relates to a nonvolatile memory array.

Nonvolatile memory arrays maintain their data even when power to the device is turned off. In one-time programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices that are relatively difficult to fabricate and operate at the very small dimensions required for competitiveness in modern integrated circuits.

Thus, a nonvolatile memory array having erasable or multi-state memory cells formed using semiconductor materials in structures that are readily scaled to small size and having a capacity of more than 1 bit/cell (i.e., $\geqq 2$ bits/cell) is desirable.

SUMMARY

A method of programming a nonvolatile memory cell includes applying at least one initialization pulse having a duration of at least 1 ms, followed by applying plural programming pulses having a duration of less than 1 ms. The cell includes a steering element located in series with a storage element, and the storage element includes a carbon material.

BRIEF DESCRIPTION OF THE DRAWINGS

FIGS. 2A and 2F are perspective views of a memory cell formed according to an embodiment of the present invention.

FIGS. 6A and 6B are current-voltage plots and FIGS. 6C, 6E, 7A, 7B and 7C are probability plots showing reading of cells

FIGS. 7E and 7F are plots of voltage versus time for programming a device of an embodiment of the invention.

FIGS. 8A to 8K illustrate one exemplary method of making an array of memory cells shown in FIG. 2D.

FIG. 9 is a Raman spectrum of polycrystalline carbon of an embodiment of the invention.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
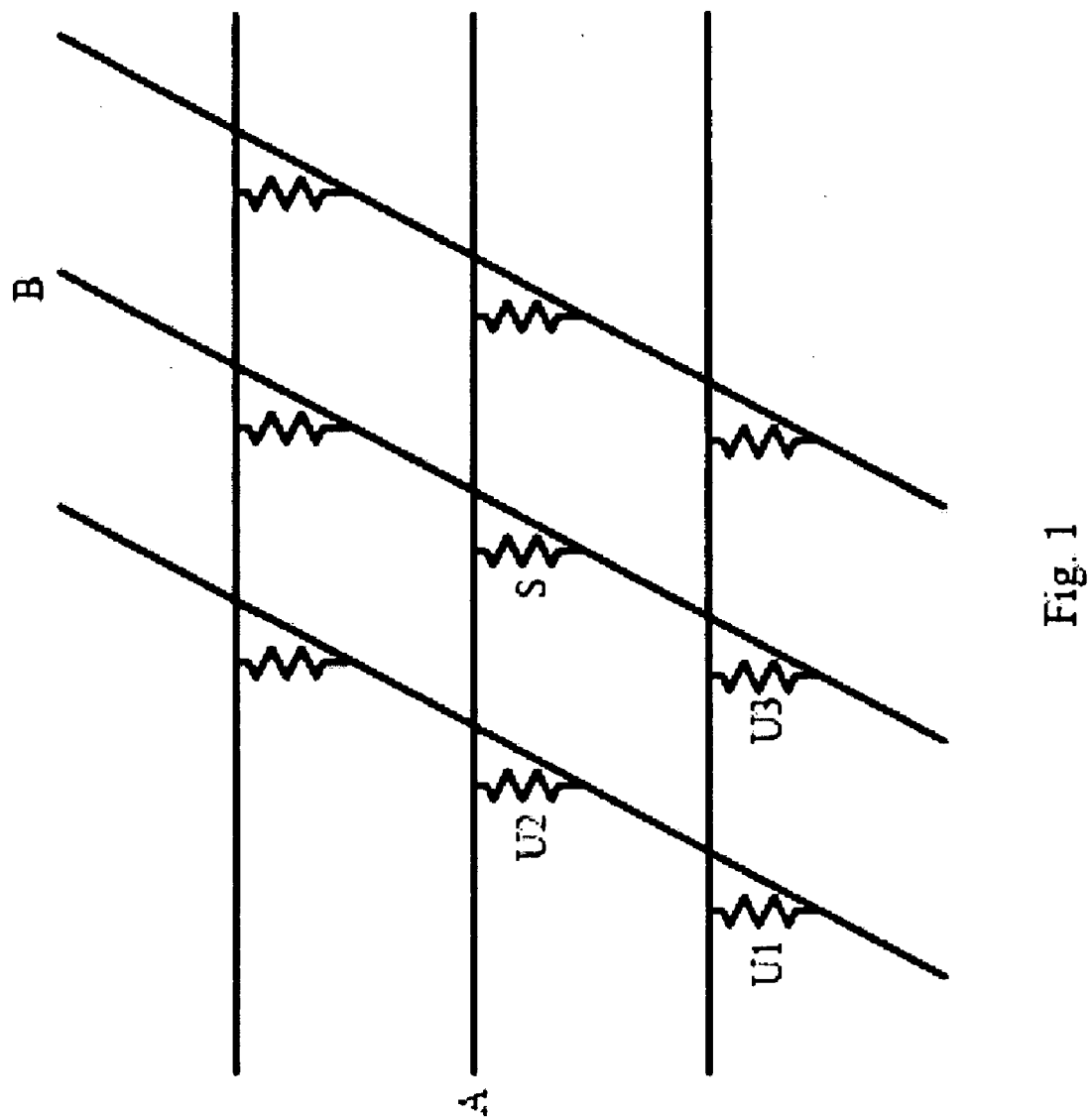
FIG. 1 is a circuit diagram illustrating the need for electrical isolation between memory cells in a memory array.

However, making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory cell with a steering element, such as a transistor or a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

In this discussion, transition from a higher- to a lower-resistivity state will be called a set transition, affected by a set current, a set or programming voltage, or a set or programming pulse; while the reverse transition, from a lower- to a higher-resistivity state, will be called a reset transition, affected by a reset current, a reset voltage, or a reset pulse which places the diode in an unprogrammed state.

In preferred embodiments, the memory cell includes a steering element, such as a transistor or a diode, and a storage element, such as a carbon resistivity switching material. Preferably, the steering element comprises a diode and the carbon resistivity switching material comprises polycrystalline carbon, amorphous carbon, graphene or carbon nanotubes (single walled, multi-walled or a mixture of single and multi-walled nanotubes). Most preferably, the diode comprises a cylindrical semiconductor diode which is located in series with a cylindrical carbon resistivity switching material layer, film or region. The diode and the resistivity switching material are disposed between two electrodes, as illustrated in FIG. 2A. The diode and resistivity switching material may have a shape other than cylindrical, if desired. For a detailed description of a the design of a memory cell comprising a diode and a resistivity switching material, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.,) each of which is hereby incorporated by reference.

FIG. 2A illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed, as shown in FIGS. 4a to 4d. Such a diode, regardless of its orientation, will be referred to as a p-i-n diode or simply diode. The storage element, such as the carbon resistivity switching material 118 is disposed above or below the diode. For example, material 118 may be disposed on the p-type region 116 or below the n-region 112 of the diode 110, as shown for example in FIGS. 3A and 3B. An optional intermediate conductive layer, such as a TiN layer, may be disposed between the diode 110 and the material 118. Top conductor 100 may be formed in the same manner and of the same materials as bottom conductor 101, and extends in a second direction different from the first direction. The semiconductor diode 110 is vertically disposed between bottom conductor 101 and top conductor 100 (i.e., electrodes 101 and 100). The diode can comprise any single crystal, polycrystalline, or amorphous semiconductor material, such as silicon, germanium, or silicon-germanium alloys. Thus, the memory cell shown in FIG. 2A comprises a vertical two terminal cell containing the two-terminal based diode steering element. However, a three-terminal cell containing a transistor steering element may also be used. The conductive path between the electrodes can be either a vertical one, a side-wall vertical one, a combination of vertical and lateral one, or a combination of vertical and lateral one with an adhesion layer, as will be described in more detail below.

In the preferred embodiments, the diode 110 comprises three different regions 112, 114, 116. In this discussion a region of semiconductor material which is not intentionally doped is described as an intrinsic region 114 as shown in FIG. 2A and FIGS. 3A-B. It will be understood by those skilled in the art, however, that an intrinsic region may in fact include a low concentration of p-type or n-type dopants. Dopants may diffuse into the intrinsic region from the adjacent n or p-doped regions (112 and 116, respectively in FIGS. 3A and 3B) or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral. The diode need not be limited to a p-i-n design as described; rather, a diode can comprise a combination of the different regions, each with different concentrations of dopants, as illustrated in FIGS. 4A-4D. Various additional cell structures and methods of making the memory cell will be described in more detail below.

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed. Such a diode preferably acts as a steering element of the memory cell because the diode does not change resistivity when certain voltage pulses are applied which are sufficient to switch the resistivity state of the carbon material.

In contrast, when an amorphous or microcrystalline silicon material is crystallized not in contact with a silicide with which it has a good lattice match, for example when silicon is crystallized in contact only with materials such as silicon dioxide and titanium nitride, with which it has a significant lattice mismatch, the resulting polysilicon will have many more defects, and doped polysilicon crystallized this way will be much less conductive as formed. Such diode can switch resistivity state when bias is applied. In this case, the diode can also serve as a resistivity switching element and as the steering element of the memory cell.

Figure 2B:
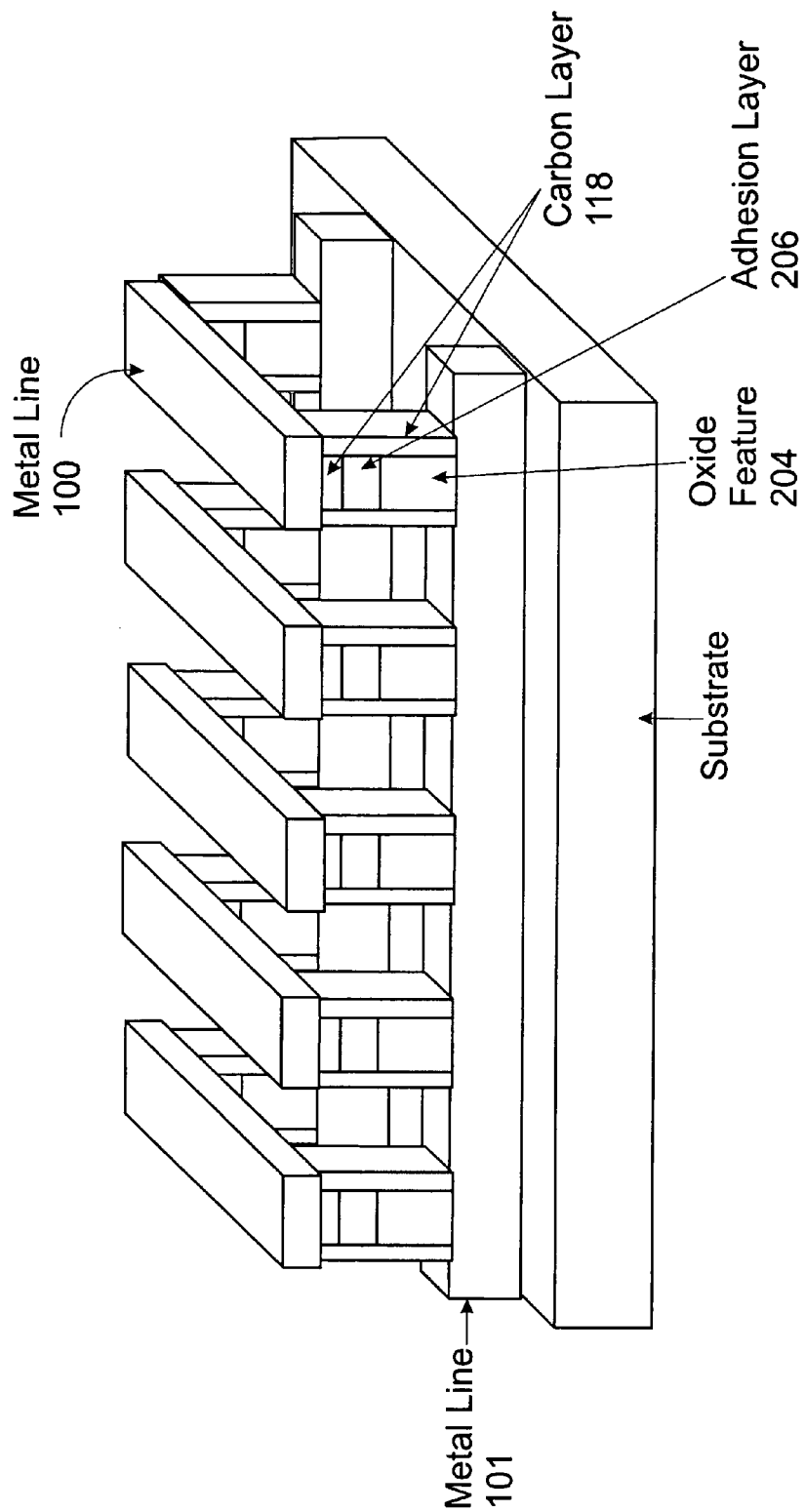
FIGS. 2B-2E are perspective views of memory cell arrays formed according to embodiments of the present invention.
Figure 2C:
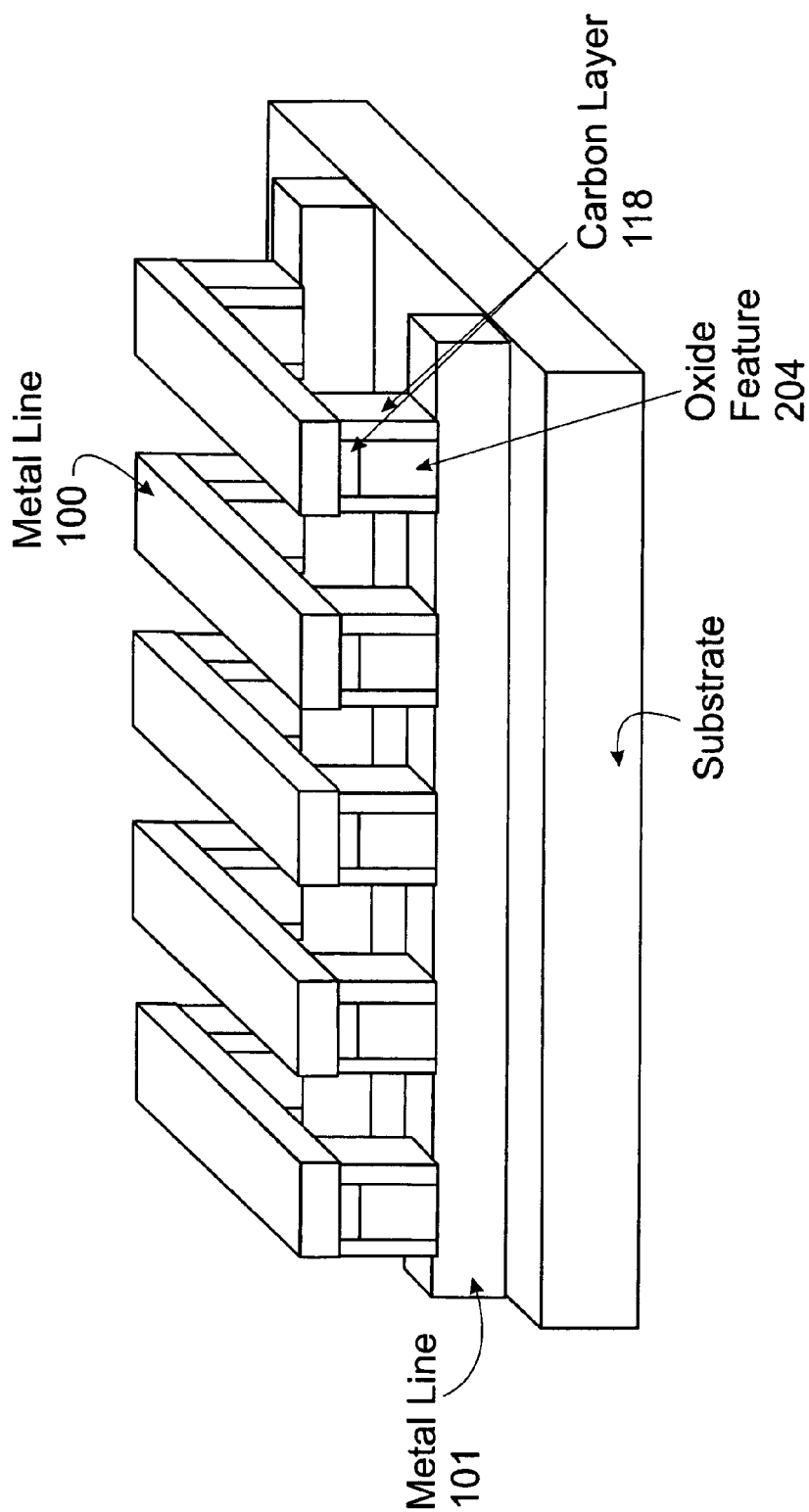
Figure 2D:
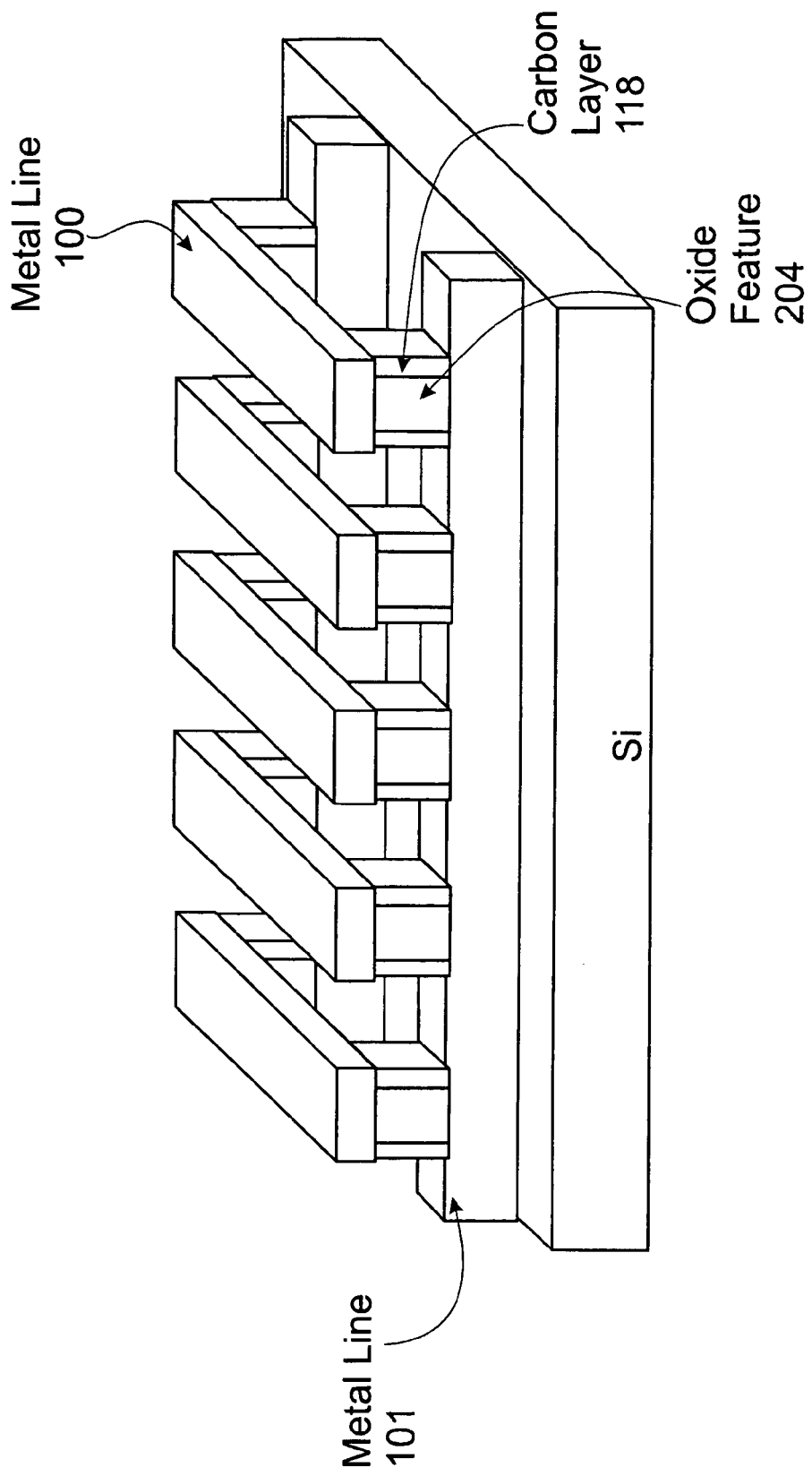

FIGS. 2B to 2E illustrate various embodiments of an array of memory cells. The diode steering element 110 is omitted from these figures for clarity. However, it should be understood that the diode steering element is located either above or below the storage element, such as the carbon resistivity switching material 118, as shown in FIG. 2A. As shown in FIG. 2B, a feature 204, such as an insulating material feature is formed above or below the diode. The feature may comprise any suitable pillar, post or rail or even a sidewall of a via or trench made of any suitable insulating material, such as silicon oxide, silicon nitride, organic insulating material, etc. The feature may have any suitable height, such as greater than 40 nm, such as 50-500 nm, for example 200-300 nm. The carbon resistivity switching material 118 is disposed on the sidewall(s) and over the top of this feature as a thin film or layer. This film or layer may have any suitable thickness, such as 2-10 nm, and a height which corresponds to the height of the feature 204 (i.e., preferably over 40 nm). Thus, the material 118 generally has a sidewall spacer shape on the sidewall of the feature. An optional adhesion layer 206, such as a silicon oxynitride or titanium nitride material is disposed on top and/or on the sides of the feature to promote adhesion between the feature and the carbon material. As shown in FIG. 2C, the adhesion layer may be omitted. Thus, the carbon resistivity switching material 118 in FIGS. 2B and 2C provides both a vertical conductive path (via the sidewall component) and a lateral (horizontal) conductive path between the upper and lower electrodes. As shown in FIG. 2D, the carbon resistivity switching material 118 is located only on the sidewall of the feature and thus provides only a vertical sidewall conductive path. A method of making this structure will be described in more detail below with respect to FIGS. 8A-8K.

Figure 2E:
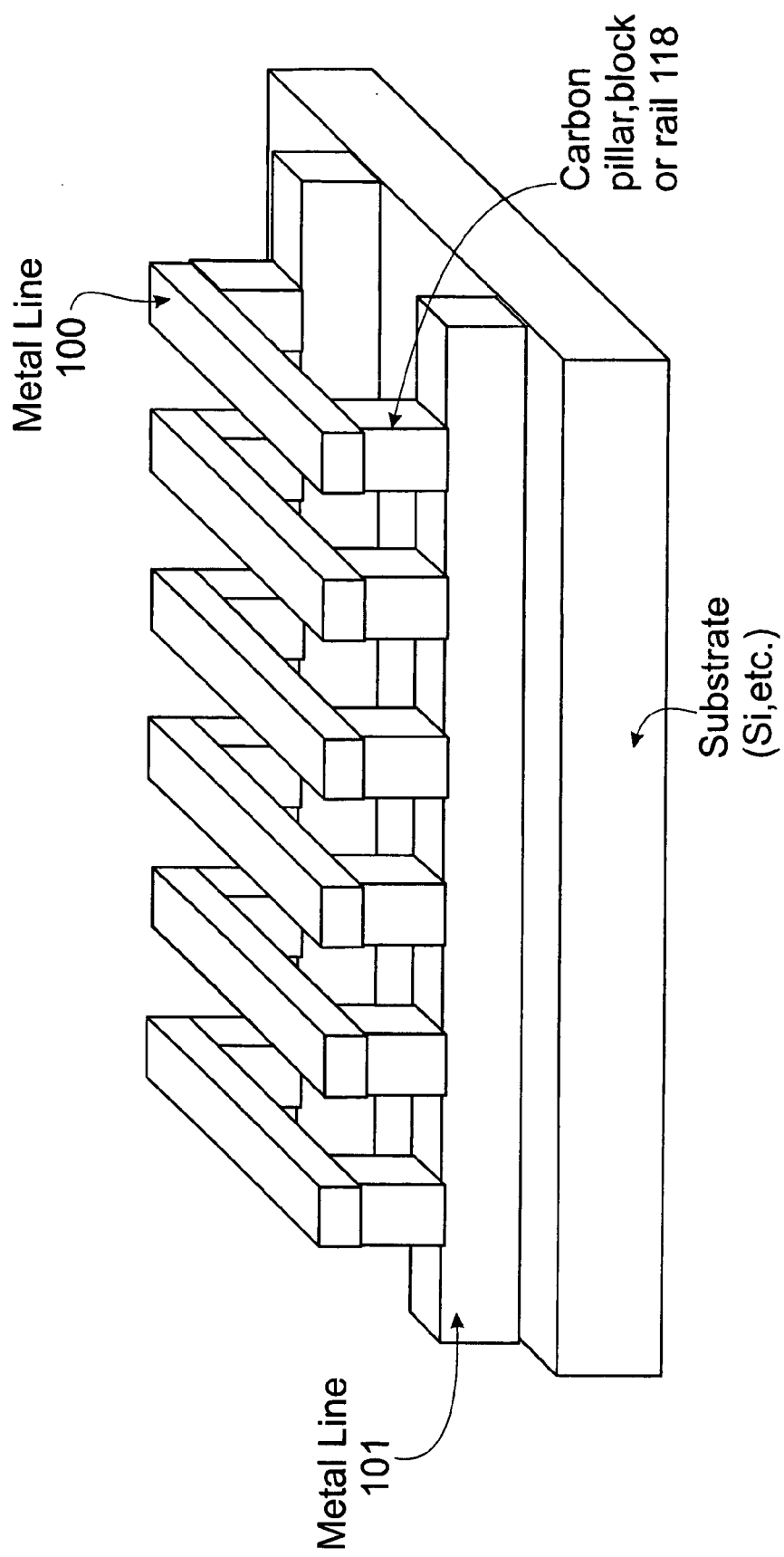
Figure 3A:
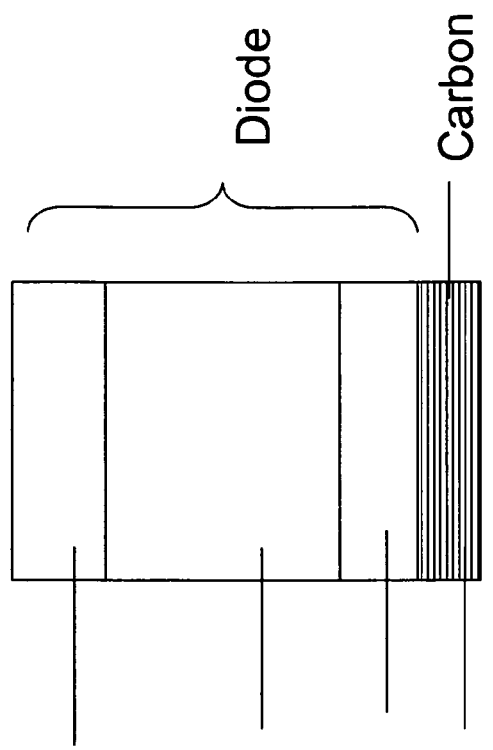
FIGS. 3A-3B are side cross-sectional views illustrating two embodiments of a memory cell.
Figure 3B:
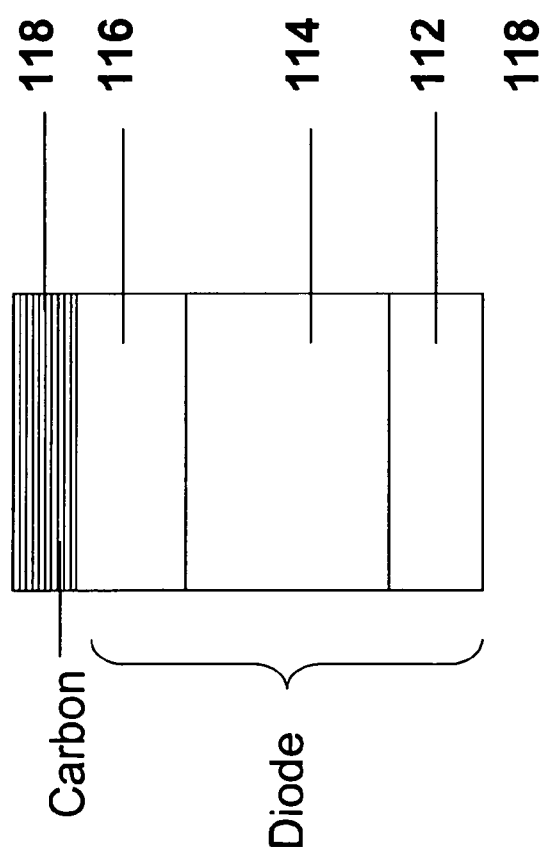
Figure 4B:
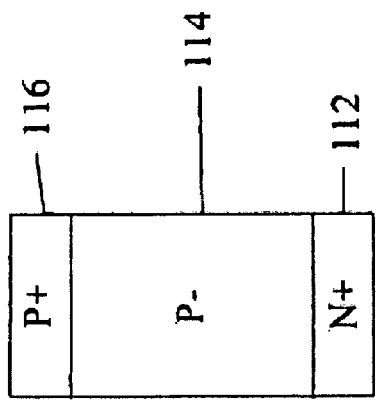
FIGS. 4A-4D are schematic side cross-sectional views illustrating alternative diode configurations according to an embodiment of the present invention.
Figure 4D:
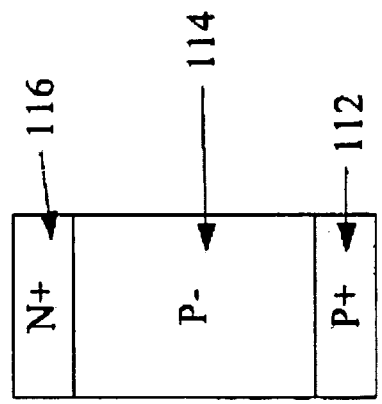
Figure 4A:
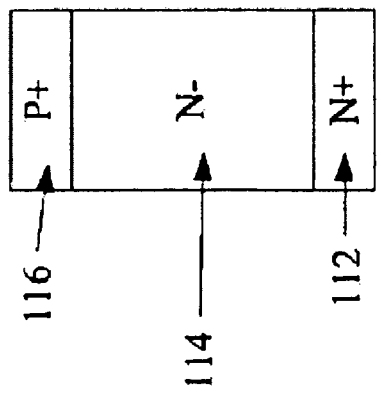
Figure 4C:
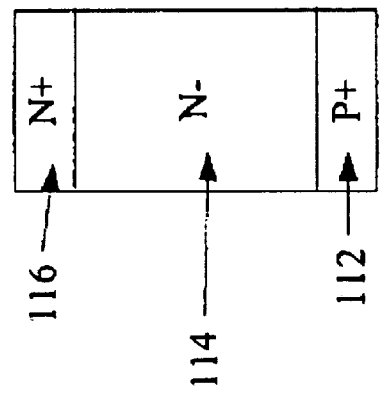

FIG. 2E shows an alternative structure, where the carbon resistivity switching material 118 is deposited into an opening, such as a trench or via in an insulating layer (not shown for clarity). The material 118 may be deposited by spray coating or spin coating a slurry or colloid containing the carbon material. In this structure, the carbon resistivity switching material 118 comprises a block or rail of material which provides a bulk vertical conductive path. In general, a height of the resistivity switching material 118 in a first direction from the first conductive electrode 101 to the second conductive electrode 100 may be greater than a thickness of the resistivity switching material in second direction perpendicular to the first direction. If the material 118 comprises a thin film or layer, then the thickness of at least a portion of the film or layer is oriented in a perpendicular direction to the current flow direction between the electrodes 100 and 101.

Figure 2F:
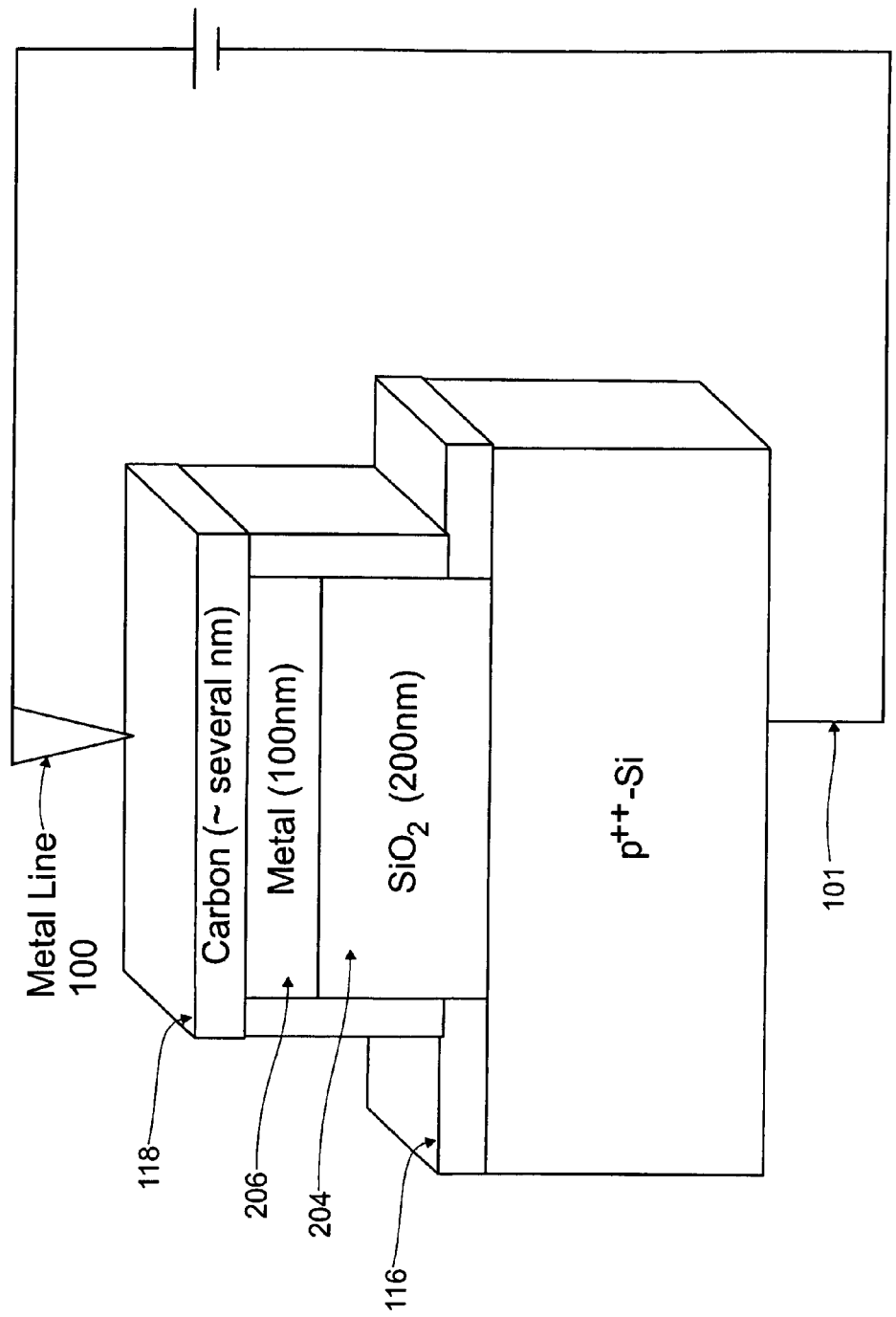

FIG. 2F shows a schematic of the memory cell test structure which corresponds to the layout of FIG. 2B, in which the p+ region 116 of the diode 110 is located below the feature 204 and the adhesion layer 206. The carbon resistivity switching material 118 is located on the sidewalls of the feature and over the adhesion layer and electrically contacts the upper p+ region of the diode 110. In a preferred embodiment of the present invention, a diode formed of polycrystalline silicon and a polycrystalline carbon storage material (i.e., the resistivity switching material) are arranged in series.

In one embodiment, the memory cell may be a one time programmable (OTP) cell. The term "one-time programmable" means that cell can be non-reversibly programmed into up to four different states. However, the cell is preferably a multi level cell (MLC) rewritable memory cell which has two or more distinct memory levels or states, such as two to four levels, which can be reversibly programmed. Thus, the cell is rewritable cell having multiple memory levels and during programming, the cell is placed into at least two different memory levels for at least two programming cycles.

One advantage of this memory cell is that its read current levels can be well defined with pulse width and pulse amplitude. The MLC writable memory cell provides a high density and a simplified architecture and process. The device, in preferred embodiments, has four distinct data states (i.e., memory levels).

The difference between the read currents of the unprogrammed and various programmed states constitutes the "window" for the memory cell. It is desirable for this window to be as large as possible for manufacturing robustness. The present inventors realized that the read current window of the programmed cell and the number of bits per cell can be increased by the following programming method.

Distinct data states of the memory cell of the embodiments of the present invention correspond to resistivity states of the carbon based storage material in series with the diode. The memory cell can be put into distinct data states by a series of distinct forward biases, preferably ranging from 2 to 20 V, more preferably from 6 to 18 V. Preferably the current flowing through the cell between any one distinct data state and any different distinct data state is different by at least a factor of two, to allow the difference between the states to be readily detectable.

Several examples of preferred embodiments will be provided. It will be understood, however, that these examples are not intended to be limiting. It will be apparent to those skilled in the art that other methods of programming a memory cell device comprising a diode and a carbon storage element will fall within the scope of the invention.

Figure 5A:
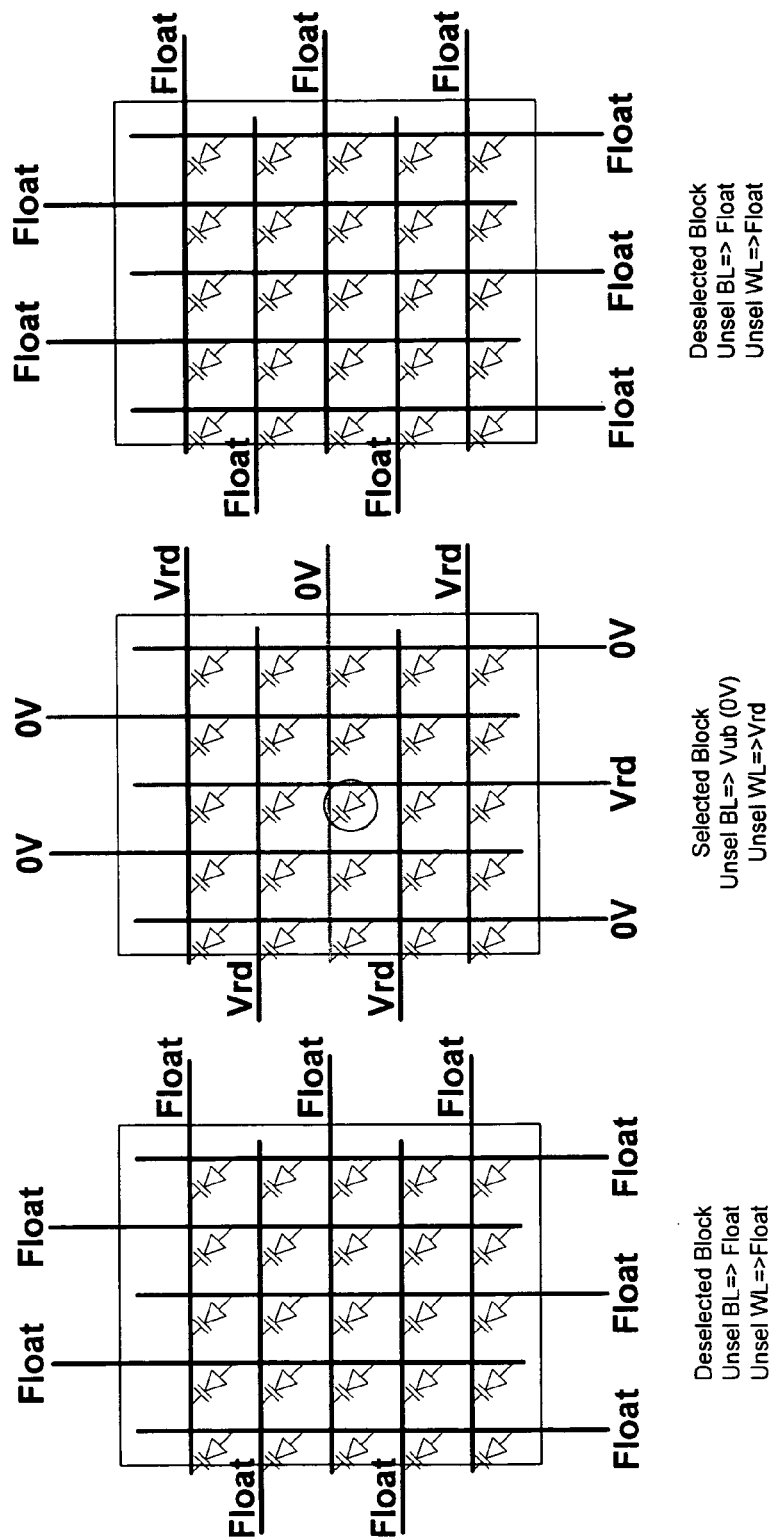
FIGS. 5A and 5B are circuit diagrams showing reading and programming operations.
Figure 5B:
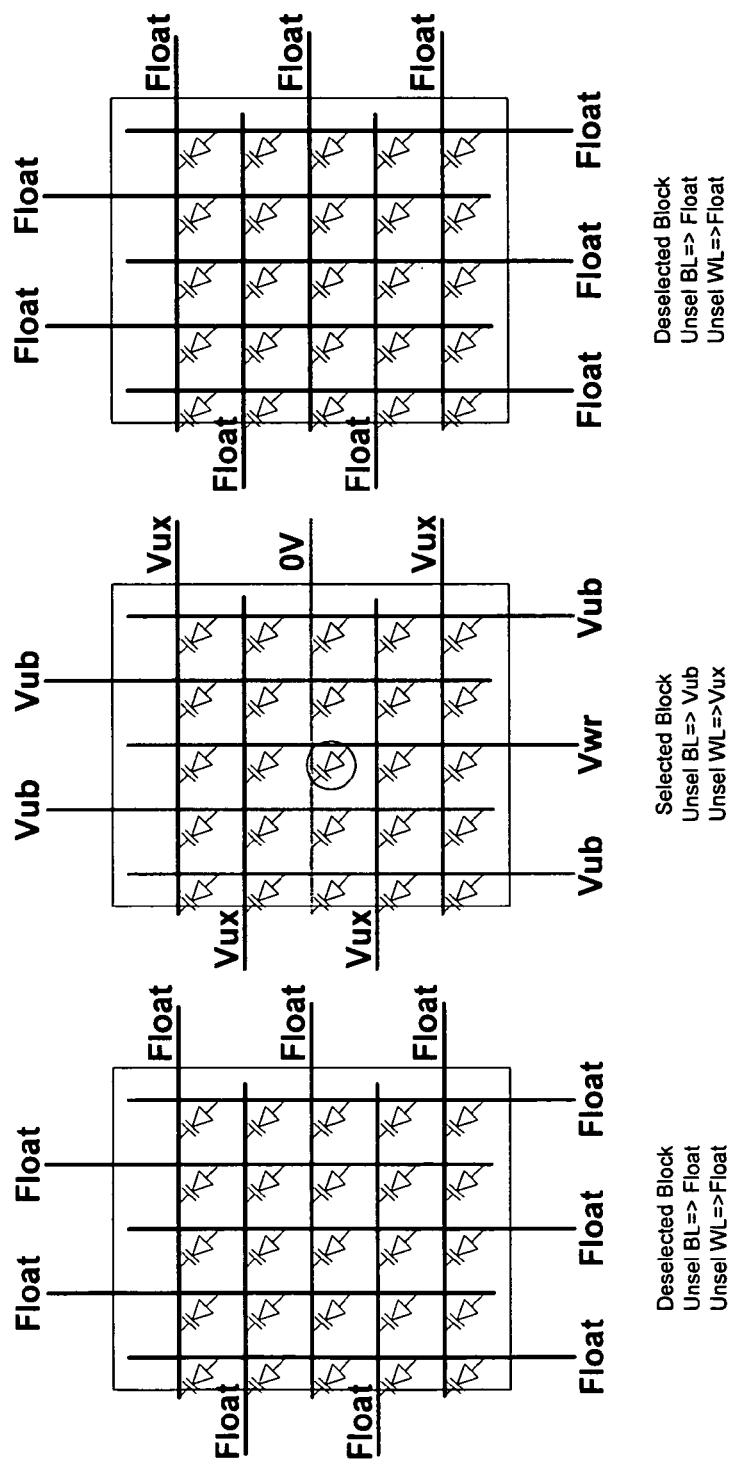

FIG. 5A shows biasing the array of memory cells in a read mode. As shown in FIG. 5A, Vrd(Vux) applied to selected bit line and unselected word lines is about 0.8 to about 2.3V (selectable by option-bits) while Vub applied to unselected bit lines and to the selected word line is zero volts. There is a wide range (0.2~2.0V voltage across the cell) for reading the selected cell on and off status without impacting the cell status. In the programming method of the embodiments of the invention, a forward bias is applied to the cell having a magnitude greater than a minimum voltage required for programming the cell. FIG. 5B shows biasing the array in a write-mode, as will be described in more detail below.

For example, if the minimum voltage required to program the cell is 16 V, then a programming forward bias of 16 or more volts, such as about 18 V to about 20 V is applied to the selected cells. If desired, the maximum voltage which can be applied without damaging the diode may be used as the programming voltage.

Figure 6B:
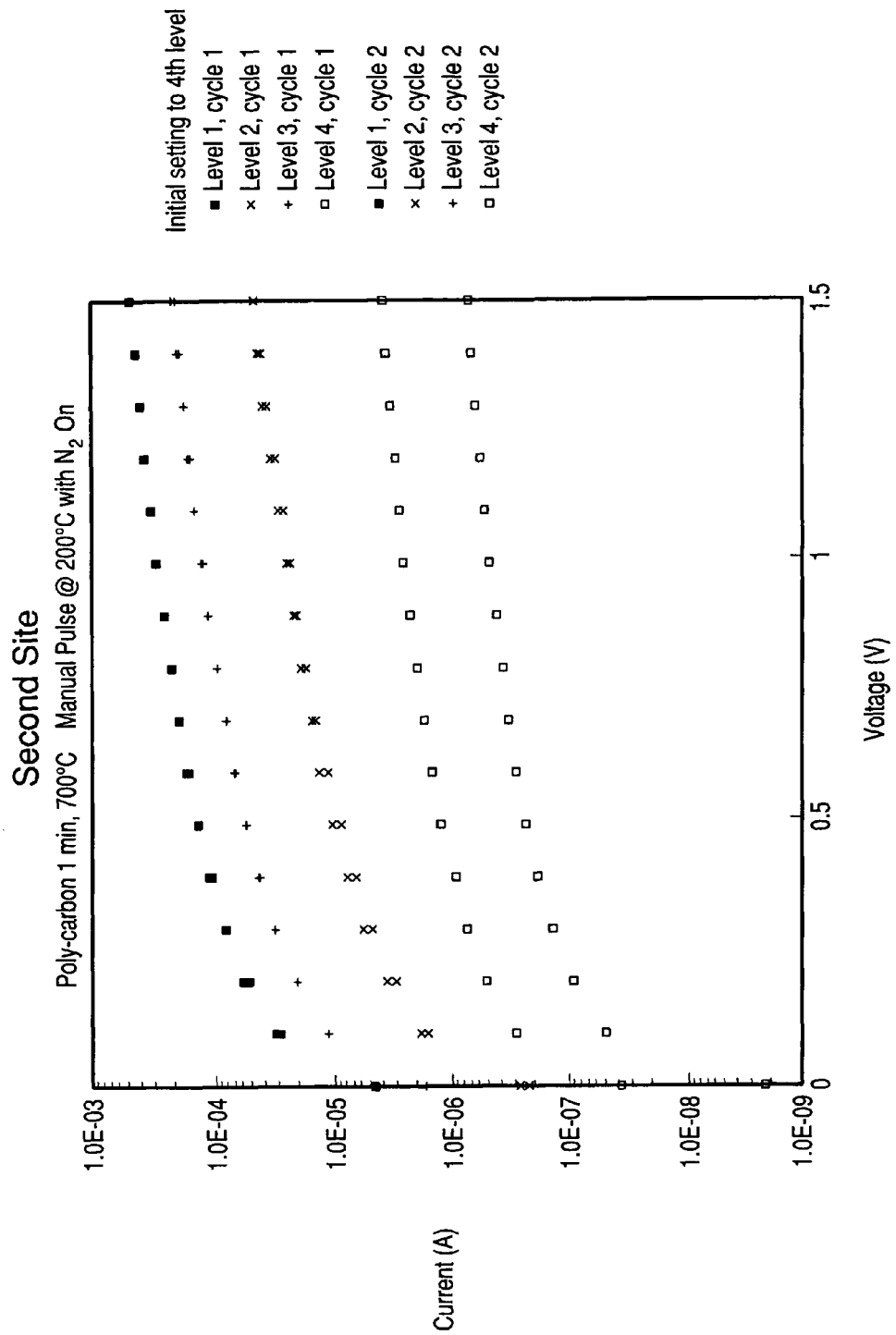
Figure 6C:
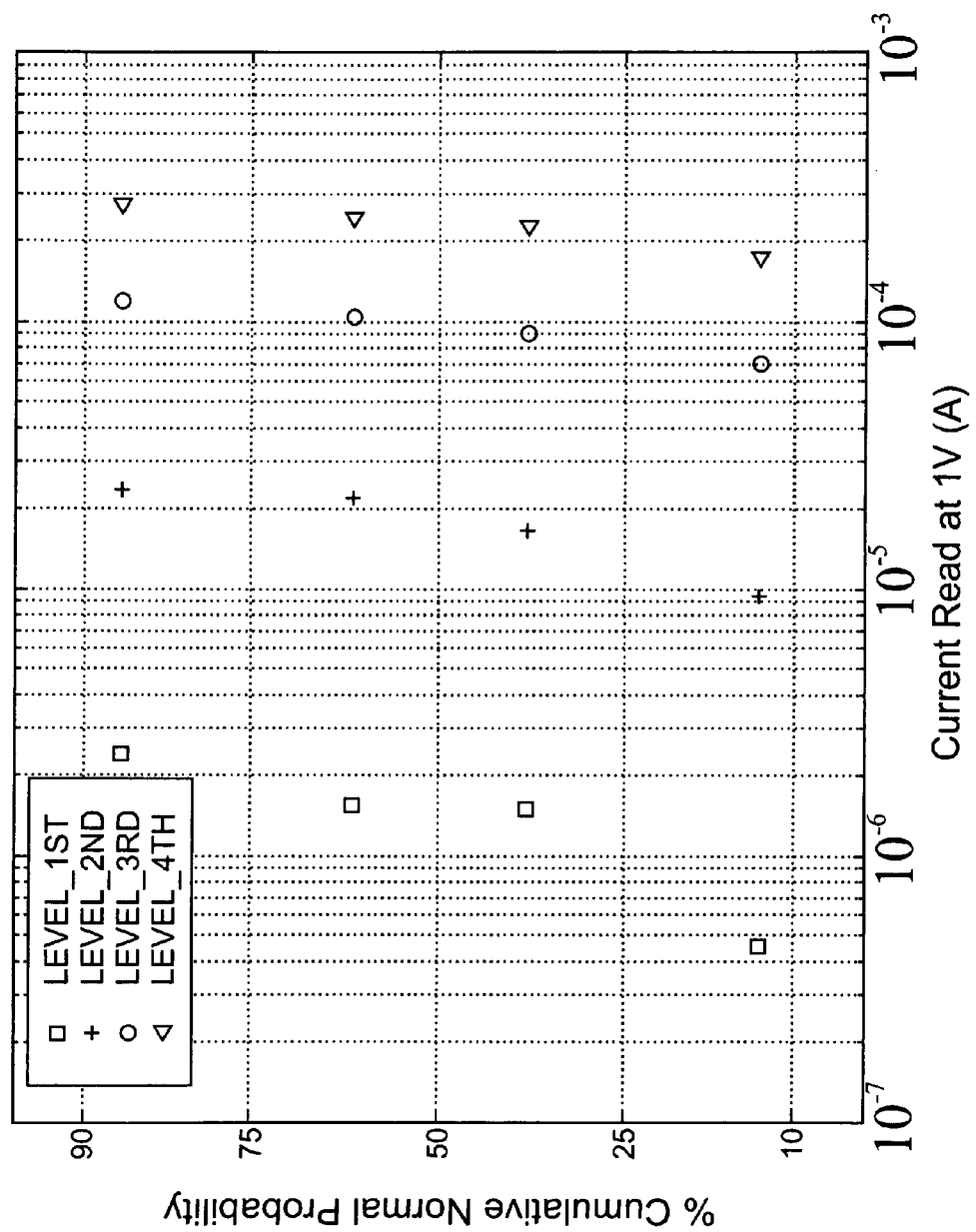

FIGS. 6A and 6B are current-voltage (IV) plots and FIG. 6C is a probability plot showing read current of a test structure memory cell shown in FIG. 2F containing a p++ single crystal silicon layer and a polycrystalline carbon storage element at 1V read voltage (at 200° C. with flowing nitrogen) in various states. The polycrystalline carbon is deposited at 700° C. over the 200 nm silicon oxide feature topped with a 100 nm thick metal (chromium) adhesion layer for one minute using thermal CVD with $H_2$ and $C_2H_2$ source gases in a 3:1 ratio. It should be noted that this device was constructed for test purposes and that a diode may be included instead of the p++ region in a memory cell.

The test structure cell of FIG. 2F was tested at two different sites, with both sites exhibiting similar behavior. FIG. 6A shows the IV curve from the first device site and FIG. 6B shows the device curve from the second device site. The plot in FIG. 6C provides the results from both sites with two cycles for each site. The IV curves in FIGS. 6A and 6B indicate read current levels after each programming pulse operation. The read current has been swept from 0~1.5V. The device was exposed to two programming cycles performed as follows. There is no state being changed to be observed for the read voltage less than 1.5V. The initial read current is about 200 µA at 1V (such as between 219 and 285 µA). An initial high voltage reset pulse, such as an 18V pulse with a 100 µS pulse width or duration is used to reset the device to the first memory level or state. The read current at 1V is less that 5 µA (such as about 0.5 to about 2.4 µA). Then, a first set pulse, such as a 6V set pulse with about 1 to 10 µS pulse width is used to set the device to the second memory level. The read current at 1V is less than 50 µA (such as about 9 to 24 µA). Then, a second set pulse, such as a 8V pulse with about 10 to 200 µS pulse width is used to set the device to the third level. The read current at 1V is less than 150 µA (such as about 60 to 118 µA). Then, a third set pulse, such as a 10V pulse with an about 100 mS pulse width is used to set the device to the fourth (or initial) memory level. The read current at 1V is above 150 µA (such as about 170 to 272 µA). The read current measured from the first and the second sites on the device after each programming pulse is shown in Tables I and II, respectively.

TABLE I

| | 1st Site | | | |
|---|---|---|---|---|
| | 18 V 100 uS 1st level | 6 V 1~10 uS 2nd level | 8 V 10~200 uS 3rd level | 10 V 100 mS 4th level |
| 1st cycle | 1.54E−06 | 1.65E−05 | 9.00E−05 | 2.19E−04 2.25E−04 |
| 2nd cycle | 1.48E−06 | 9.42E−06 | 6.91E−05 | 1.72E−04 |

TABLE II

| | 2nd Site | | | |
|---|---|---|---|---|
| | 18 V 100 uS 1st level | 6 V 1~10 uS 2nd level | 8 V 10~200 uS 3rd level | 10 V 100 mS 4th level |
| 1st cycle | 4.52E−07 | 2.34E−05 | 1.03E−04 | 2.85E−04 2.44E−04 |
| 2nd cycle | 2.38E−06 | 2.17E−05 | 1.18E−04 | 2.72E−04 |

Figure 6D:
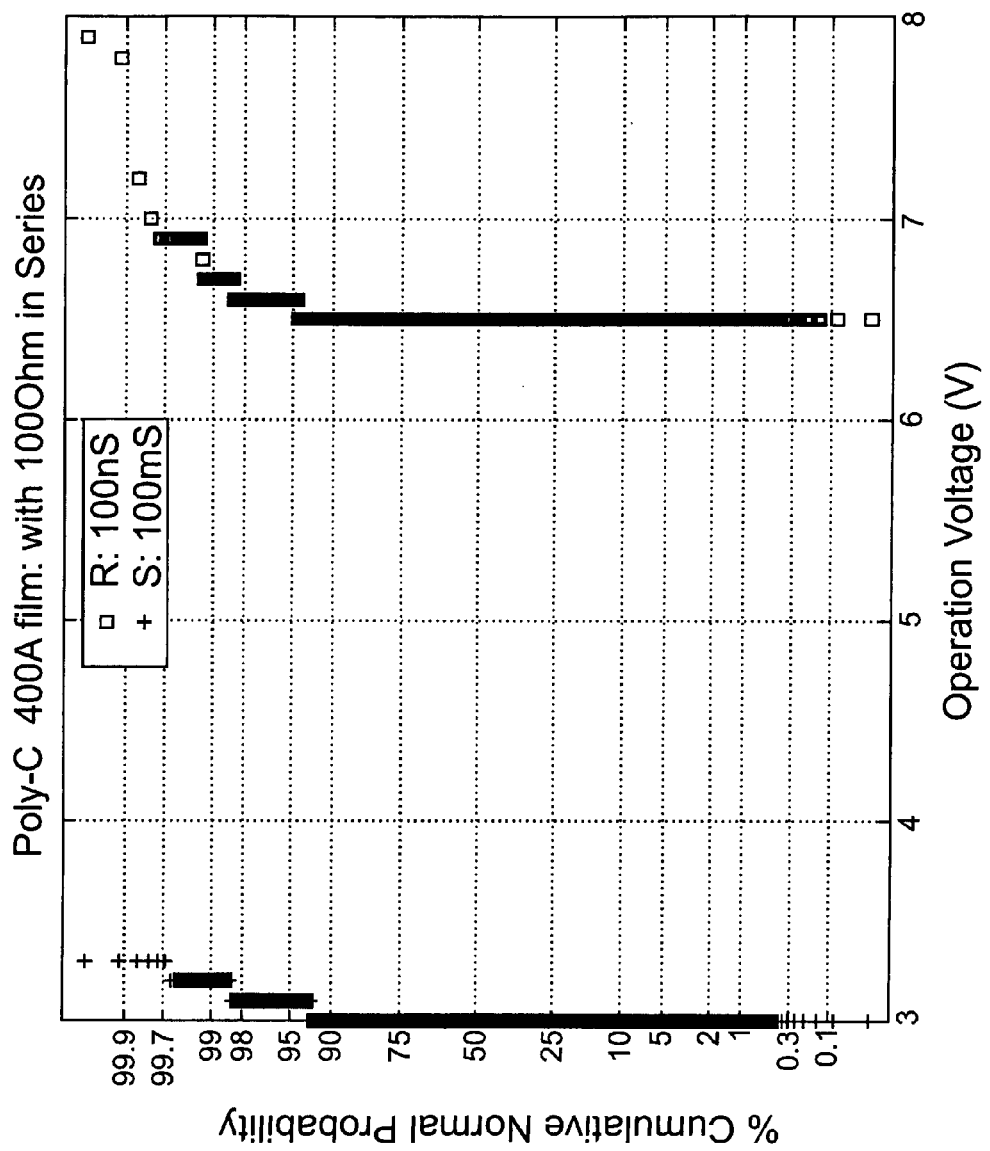
FIG. 6D is a probability plot of programming voltage of a cell of the embodiments of the invention.
Figure 6E:
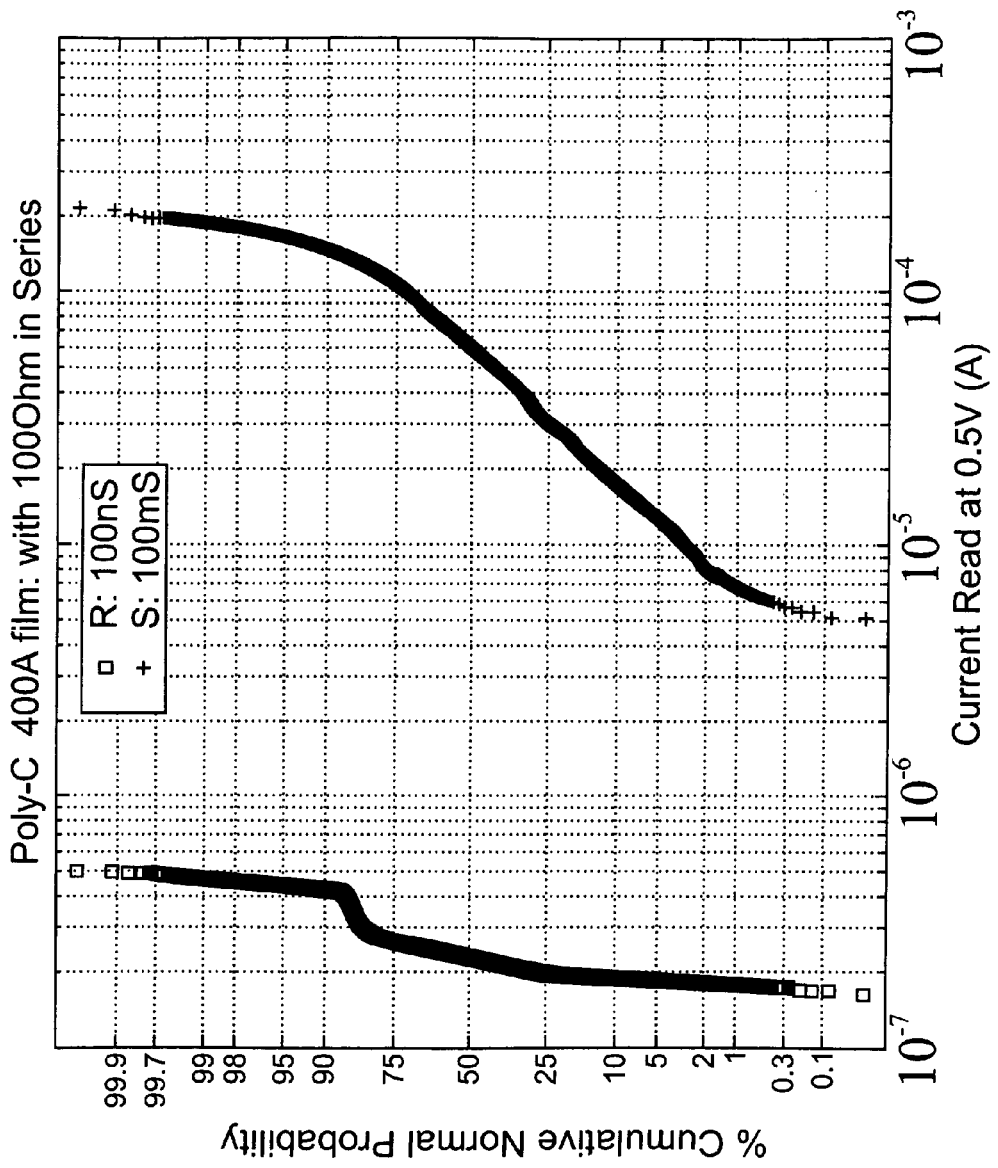

As shown in FIGS. 6A-6C and in Tables I and II, the read current at both sites in the device is similar after the first and the second programming cycles. Also, both sites have the consistent behavior to indicate this memory cell is a MLC writable memory cell. FIG. 6D shows the probability plot of the set and reset pulse voltages for 2000 programming cycles. FIG. 6E shows the probability plot of the read current at 0.5V. The set pulses had a 100 millisecond pulse duration and the reset pulses had a 100 nanosecond pulse duration. The device tested contained a 40 nm thick polycrystalline carbon film with a 100 ohm resistance in series. This shows that the test device can be cycled for at least 2000 cycles without failure. Other voltages and pulse durations may be used, depending on the materials used and device design.

For example, with respect to the write voltages shown in FIG. 5B, the following non-limiting values of the applied voltage may be applied to the bit lines and word lines, where Vwr is applied to the selected bit line, Vux is applied to unselected word lines and Vub is applied to the unselected bit lines (and zero volts applied to the selected word line). First memory level (reset pulse): Vwr=18.3~19.3V (selectable by option-bits); Vux=18.3~19.3V (selectable by option-bits); Vub=0.3~0.9V (selectable by option-bits). Second memory level (first set pulse): Vwr=6.3~7.3V (selectable by option-bits); Vux=6.3~7.3V (selectable by option-bits); Vub=0.3~0.9V (selectable by option-bits). Third memory level (second set pulse): Vwr=8.3~9.3V (selectable by option-bits); Vux=8.3~9.3V (selectable by option-bits); Vub=0.3~0.9V (selectable by option-bits). Fourth memory level (third set pulse): Vwr=10.3~11.3V (selectable by option-bits); Vux=10.3~11.3V (selectable by option-bits); Vub=0.3~0.9V (selectable by option-bits). A lower voltage may also be used, such as in the final set programming step. In general, the reset pulse may have a higher voltage than some or all of the set pulses. Each set pulse may optionally but not necessarily have a higher voltage and a longer pulse width than a preceding set pulse. The set and reset pulses are forward bias pulses with respect to the diode 110.

One advantage of the above described memory cell is that its read current levels can be well defined with pulse width and pulse amplitude.

In another embodiment, one or more initialization pulses are used to in the method of programming the device. Due to the complexity of the carbon resistivity switching material, such as nanotubes, amorphous carbon, polycrystalline carbon or graphene, the time needed to program and erase CNT or carbon film is in the order of milliseconds (msec) using a conventional operation algorithm. In one aspect of this embodiment, a stepped voltage amplitude and/or a stepped pulse width can be used during programming. However, these steps enlarge the distribution of operation condition. As resistivities of the rewritable elements are dependent on the electrical signals, it also introduces a wide distribution of on/off current, which makes the on/off windows smaller. In another aspect of this embodiment of the invention, a relatively high voltage amplitude and relatively long duration initialization pulse is applied first to the carbon resistivity switching material. Thereafter, shorter duration programming pulses are applied to the material to program the memory cell. This allows programming the cell at much higher speeds and hence meet the product bandwidth requirements. Also, the initialization pulse helps to improve the distribution of operation condition, therefore, the distribution of On/Off current.

Preferably, the initialization pulse has a pulse width that is 1 millisecond or greater, such as 2-200 ms. The initialization pulse voltage amplitude is preferably at least 10V, such as 10 to 14V, for example 10 to 12V (i.e., an initialization set pulse). Other pulse duration and voltages may also be used. Plural initialization pulses may also be used, such that an initialization reset pulse having a voltage amplitude of 10 to 20V may follow the set initialization pulse. However, the first reset pulse does not have to be an initialization pulse and may have a pulse width of less than 1 ms. The subsequent programming pulses, such as reset and/or set pulse preferably have a pulse width of less than 1 ms, such as 100 nm to 500 microseconds, such as 10 to 200 microseconds, for example about 100 microseconds. The set pulses preferably have a lower voltage amplitude than the initialization pulse.

Without wishing to be bound by a particular theory, the present inventors believe that the initialization pulse provides the following effect to the device. The current understanding of switching in carbon nanotubes is the mechanical switching through Van der Waals force or electrical switching through quantum wave of overlapping. The current understanding of switching in polycrystalline carbon or graphene is related to the change in hybridization of the C—C bonds or the variation in distance between the graphene flakes. It is believed that the relatively wide (i.e., long duration) initialization pulse connects the carbon nanotubes or carbon flakes in the respective carbon material to make the carbon material more uniform (i.e., more compressed or fused together). This improves the electrical connection through each cell between the upper and lower electrodes. After the initialization, the switching path has to be limited to happen only at the highest possible place. Therefore, the initialization improves distribution of set and reset operation range and also that of On and Off read current by reducing the impact from the random distribution of geometries and structures of the carbon films due to their intrinsic material properties. The initialization pulse width and pulse amplitude should be in a range to make all the possible conductive paths in the array connected.

Figure 7A:
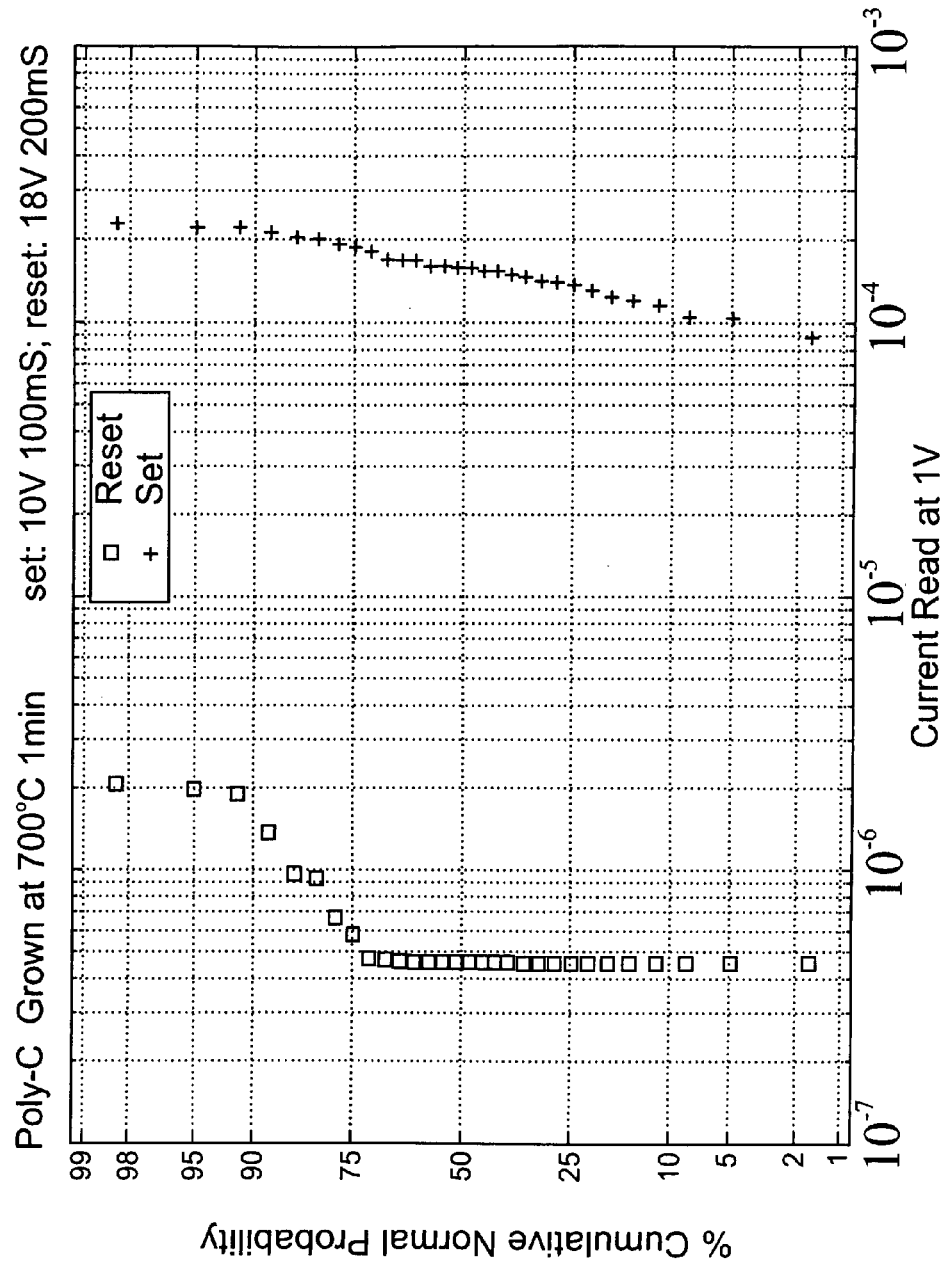
Figure 7B:
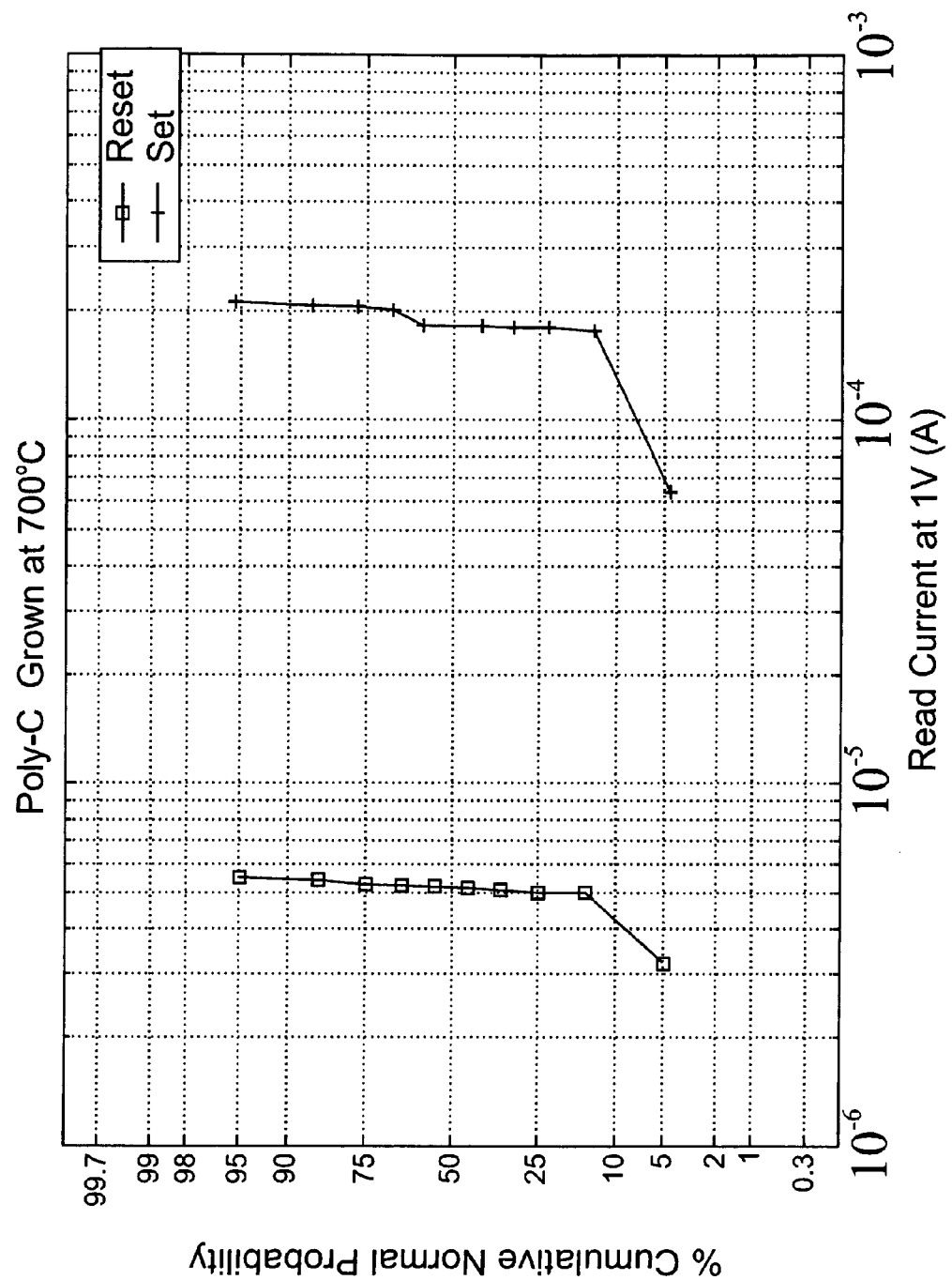

FIG. 7A shows a probability plot for a rewritable nonvolatile memory device described above containing polycrystalline carbon resistivity switching films grown at 700 C for 1 minute. This device was not subject to an initialization pulse. The reset pulse width is 200 ms and the reset pulse voltage amplitude is 18V. The set pulse width is 100 ms and the set pulse voltage amplitude is 10V. FIG. 7B shows a probability plot of a similar device after an initialization pulse has been applied. Specifically, a 10V, 200 ms long initialization pulse followed by an 18V, 200 microsecond reset pulse are provided to the device during the initialization period. Thereafter, 100 microsecond set and reset pulses (having a voltage amplitude of 10V and 18V, respectively) are applied for 10 cycles. As shown in FIG. 7B, the reset and set pulse width can be reduced to less than 1 ms (100 microseconds as shown in this Figure) after the initialization pulse while maintaining a similar read current profile to the device of FIG. 7A.

Figure 7C:
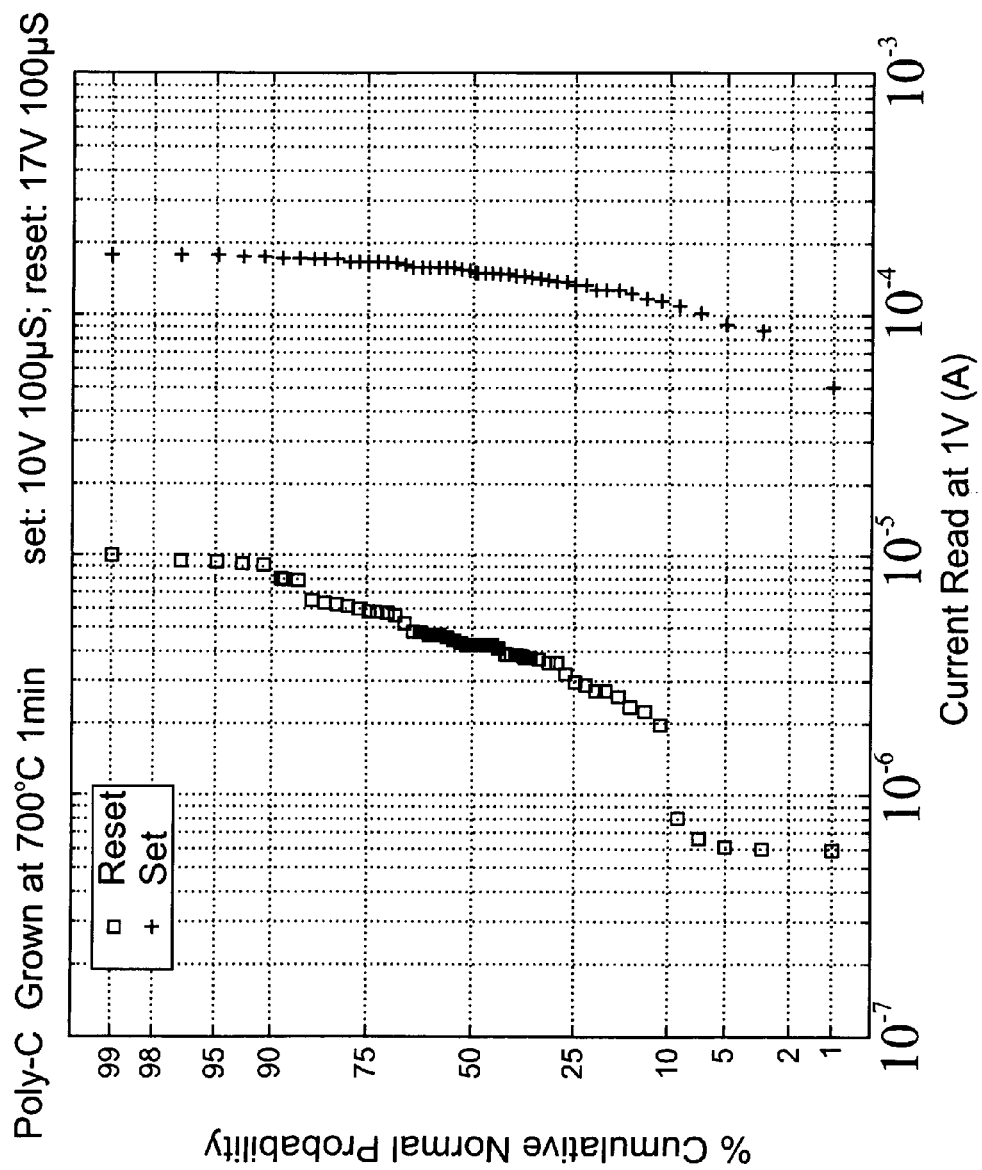

If the device lacks current limitation during the reset process, the reset process might introduce more possible switching paths. Therefore, the initialization pulse should be applied again after the device has undergone a predetermined number of programming cycles to make sure that the switching path only happens at the highest possible place. FIG. 7C shows a probability plot of a device that undergone 50 programming cycles (i.e., each memory level was reached 50 times). The initialization pulse is re-applied after every 10 cycles. The device exhibits an acceptable read current distribution. The initialization pulse may be reapplied between every 2 to 50 cycles, such as every 5 to 20 cycles, depending on the device and programming parameters.

Figure 7D:
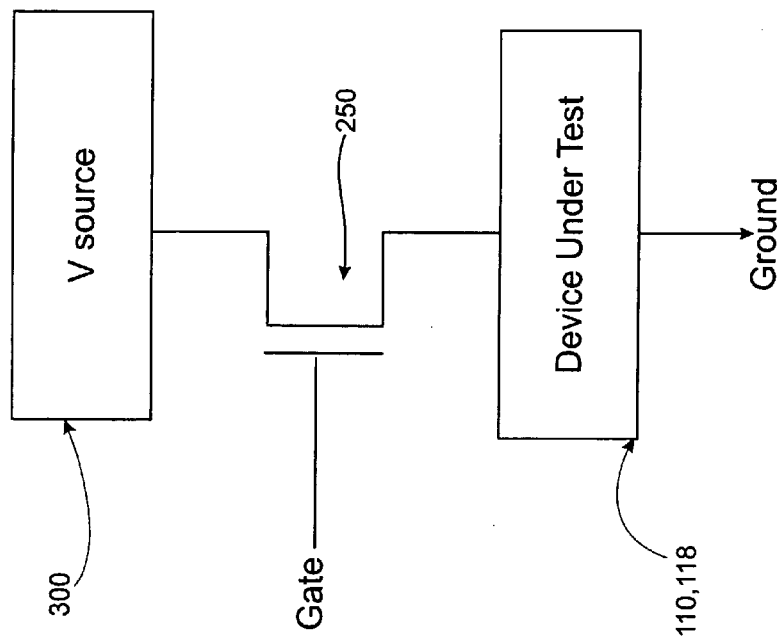
FIG. 7D is a circuit schematic of a device of an embodiment of the invention.

If current limitation is used, then it may be possible to avoid re-applying the initialization pulse after a certain number of programming cycles. As shown in FIG. 7D, a current limiting device 250, such as a transistor or a resistor is provided between the voltage source 300 and the memory device 110, 118. The current limiting device decreases or prevents disturbance of the carbon material during the relatively high voltage reset step by limiting the current to the carbon material during the reset step. This allows the improvement from the initialization to be more pronounced in terms of speed performance, On/Off read current distribution, and set/reset operation distribution.

If desired, the set and/or reset pulses may be stepped in regard to voltage amplitude and/or pulse duration. FIG. 7E shows a plot of voltage amplitude versus time to illustrate stepped pulse width set and reset pulse trains. FIG. 7F shows a plot of voltage amplitude versus time to illustrate stepped voltage amplitude set and reset pulse trains. Both pulse amplitude and width may be stepped at the same time. A read step may be performed after each individual pulse to verify the On/Off condition.

In summary, a relatively large and long initialization pulse is used to make all the possible conductive paths connected. With a current limiting device, such as a transistor or any other load to limit the current to a desired range during the reset process, keeps the switching path only at the highest possible conductive path. Therefore, it has the potential to improve the yield, cycling, set/reset operation distribution, on/off read current window, and especially speed performance.

Generally, a device for programming the memory cells is a driver circuit (300 in FIG. 7D) located under, over, or adjacent to the memory cell. The circuit can have a monolithic integrated structure, or a plurality of integrated device packaged together or in close proximity or die-bonded together. For a detailed descriptions of the driver circuit, see for example, U.S. patent application Ser. No. 10/185,508 by Cleeves; U.S. patent application Ser. No. 09/560,626 by Knall; and U.S. Pat. No. 6,055,180 to Gudensen et al., each of which is hereby incorporated by reference.

The memory cell may be fabricated by any suitable methods. For example, the methods described U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.,) which are incorporated by reference in their entirety may be used.

Figure 8A:
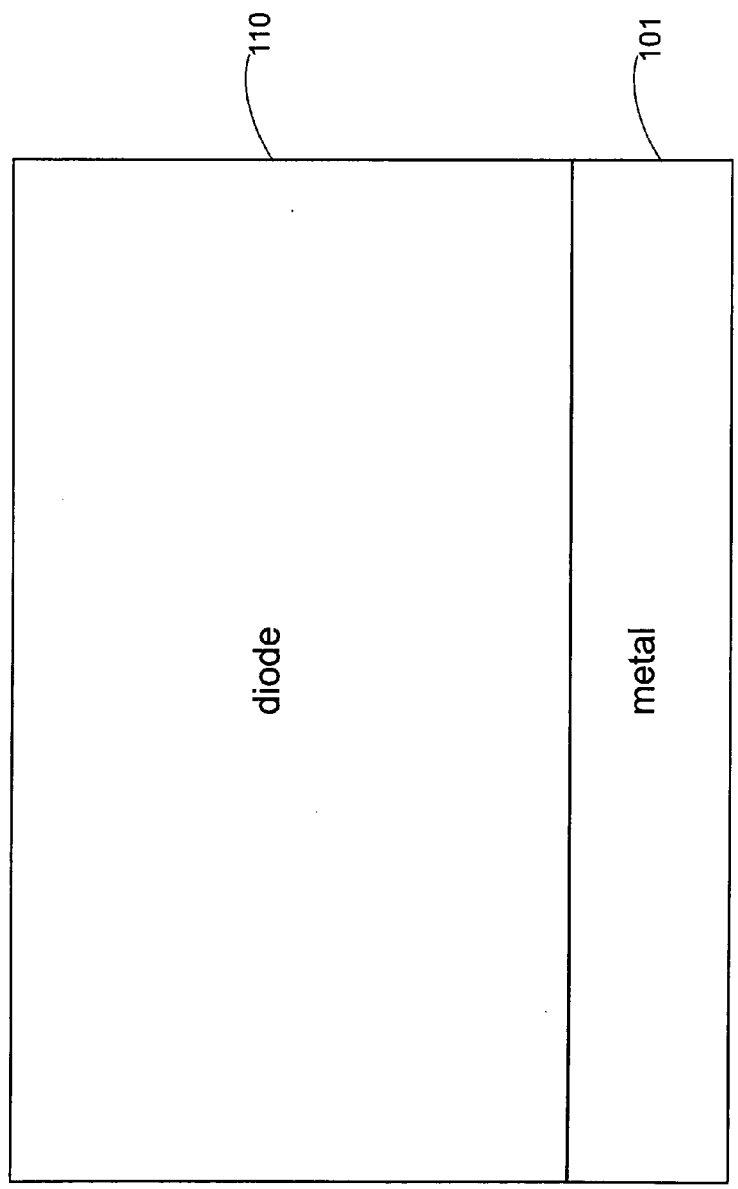
Figure 8B:
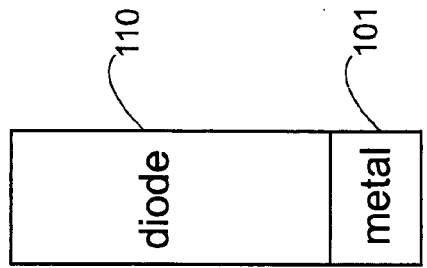
Figure 8B:
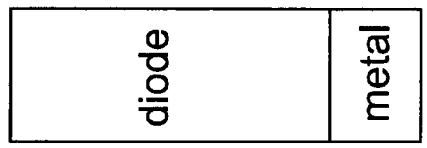
Figure 8B:
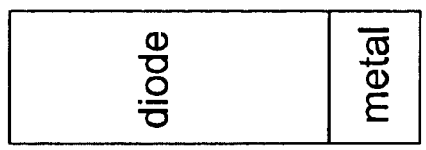
Figure 8B:
Figure 8C:
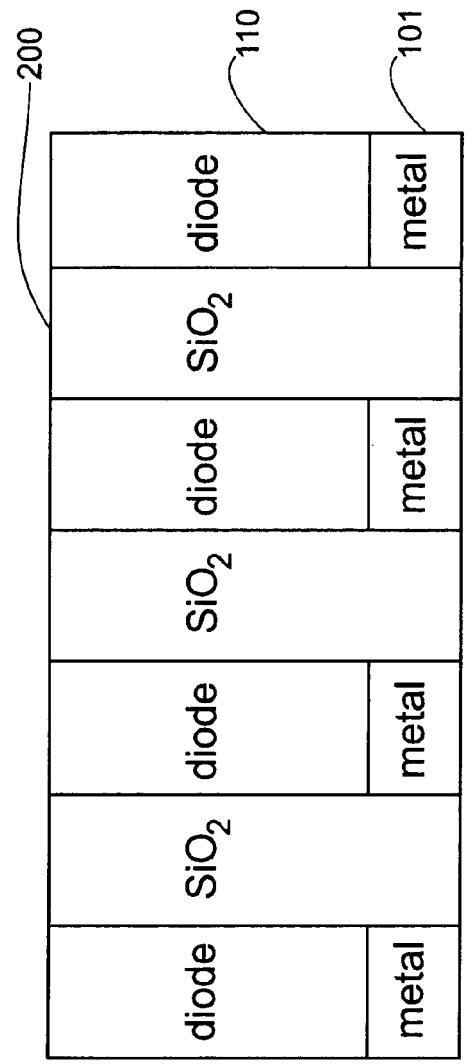

FIGS. 8A to 8K illustrate one exemplary method of making an array of memory cells shown in FIG. 2D. As shown in FIG. 8A, the diode 110 semiconductor layers 112, 114, 116 are formed over a lower electrode 101 using any suitable deposition and patterning methods, including in-situ doping during deposition and/or ion implantation into an intrinsic region. The diode 110 and lower electrodes 101 are then patterned either sequentially or in the same step, as shown in FIG. 8B. Preferably, the diodes are formed in shape of a cylindrical pillar and the lower electrodes comprise rails (which extend in and out of the page and connect plural diodes). A gap fill insulating layer 200, such as silicon oxide, silicon nitride, organic insulating material, etc. is formed between the lower electrodes and the diodes and is then planarized. This step is shown in FIG. 8C. The insulating layer may be formed in two separate steps as follows. The lower portion is formed between the electrodes first, followed by planarization step (such as a chemical mechanical polishing (CMP) or etchback step), followed by diode formation, followed by forming the upper portion of the insulating layer between the diodes, and followed by another planarization step.

Then, as shown in FIG. 8D, another insulating layer 202, such as silicon oxide, silicon nitride, organic insulating material, etc., is formed over the diodes. This insulating layer is then patterned into features 204 having any suitable shape, such as pillars, rails, blocks, etc, as shown in FIG. 8E. The upper surface of the diode 110 is partially or fully exposed between the features. For example, each feature may be located in every other space between the diodes (i.e., over each second of the insulating layer 200 located between the diodes 110).

Figure 8F:
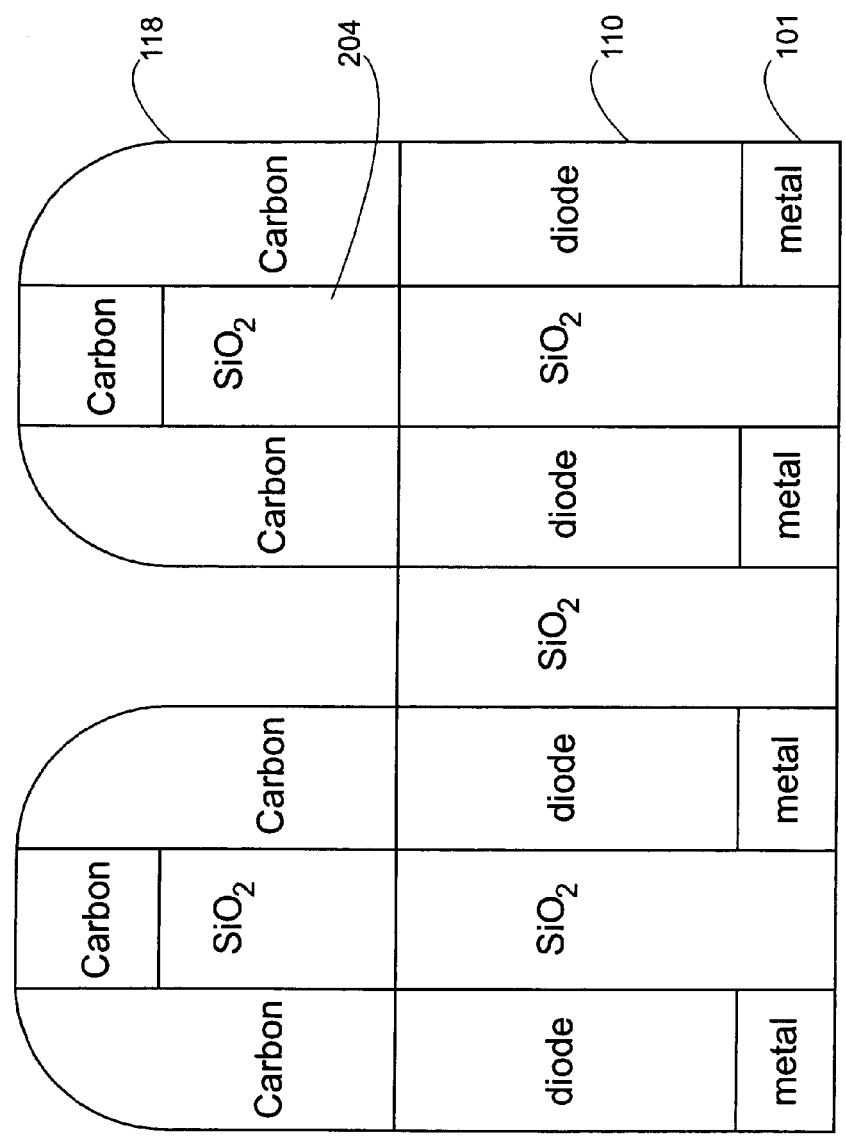

As shown in FIG. 8F, the carbon resistivity switching material 118 film or layer is deposited over the features and on the sidewalls of the features. The film 118 may be formed by thermal CVD growth (1-2 minutes at 650 to 800 C using $H_2$ and $C_2H_2$ source gases for polycrystalline carbon) or by spray coating or spin coating a colloid or slurry of nanotubes, graphene or polycrystalline carbon in a solvent.

The Raman spectrum of the CVD deposited polycrystalline carbon material is shown in FIG. 9. The spectrum has first Raman peak between 1300 and 1350 $cm^{-1}$ (around 1325 $cm^{-1}$) and a second Raman peak between 1600 and 1650 $cm^{-1}$ (around 1625 $cm^{-1}$).

Figure 8G:
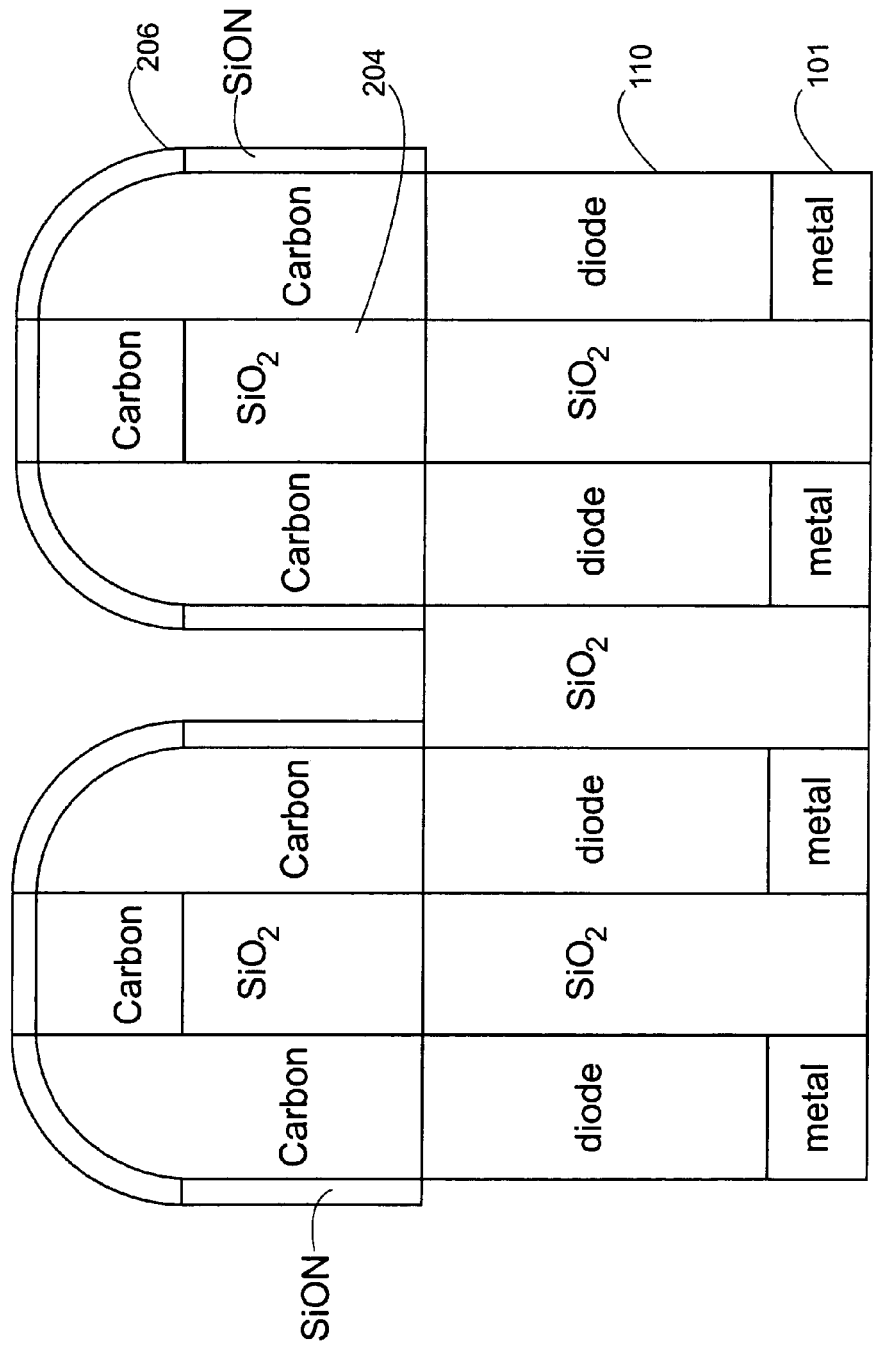

The film or layer 118 may be subjected to a spacer type etch to remove it's portions from the upper surface of regions 200. This etch makes the film 118 discontinuous, such that the portion of thin film 118 storage element in one cell does not contact a portion of the thin film 118 storage element of an adjacent cell. If desired, an optional adhesion layer 206, such as silicon oxynitride or another suitable material is deposited over the film 118, as shown in FIG. 8G. Alternatively, the adhesion layer may also be located over each feature, such that it would be located under the carbon film 118. TiN or other materials may also be used instead of SiON for layer 206.

Figure 8H:
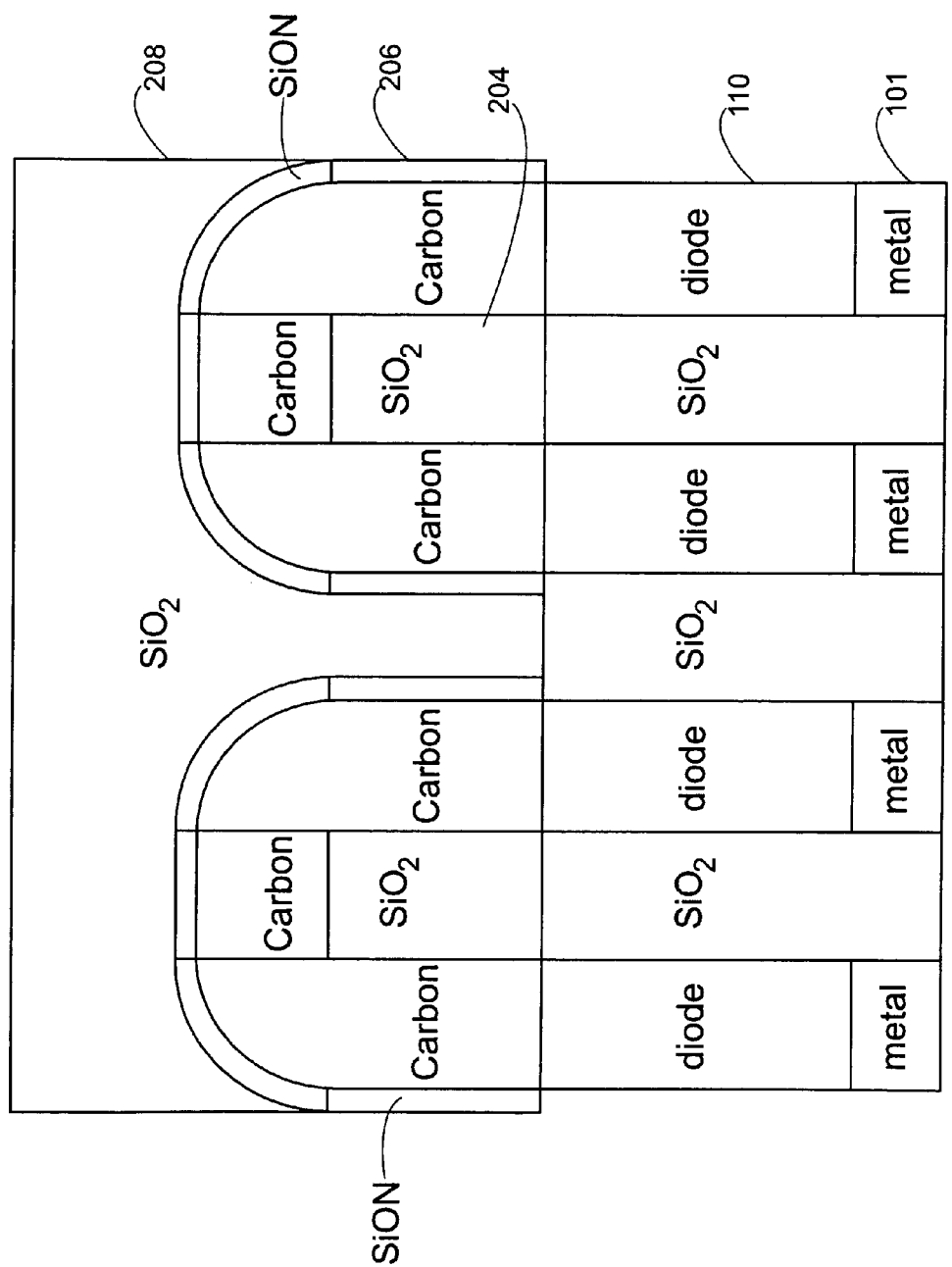
Figure 8I:
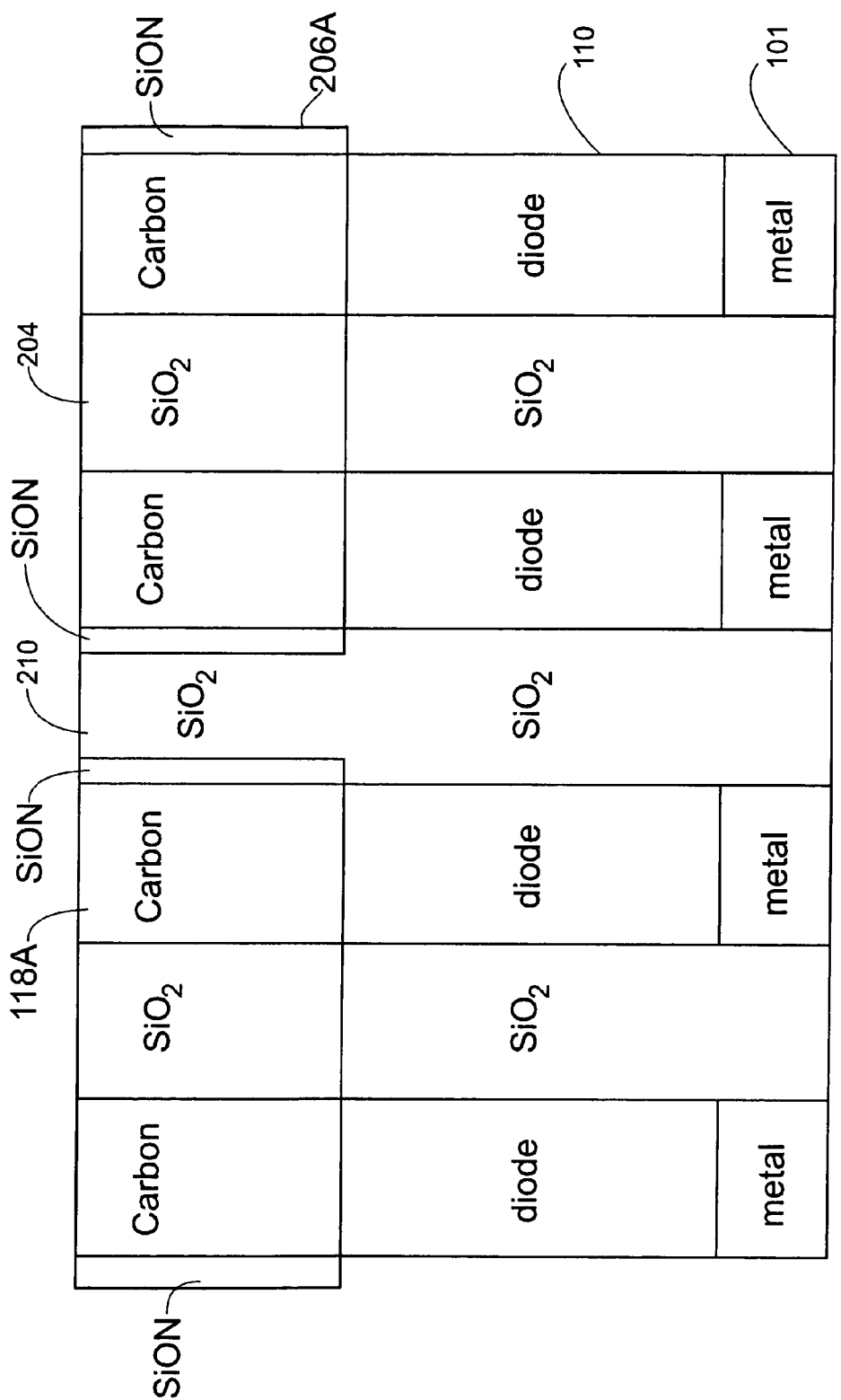

Then, another gap fill insulating layer 208 (such as silicon oxide, silicon nitride, organic insulating material, etc.) is deposited over the carbon film 118 and the adhesion layer, as shown in FIG. 8H. This gap fill insulating layer is then planarized by CMP or etchback with the upper surface of the features 204 to form gap fill insulating regions 210, as shown in FIG. 8I. During this planarization step, the carbon film 118 and the adhesion layer are removed from the upper surface of each feature. Thus, the carbon film 118 remains only on the sidewalls of the features and the upper surface or edges of the carbon film sidewalls 118A are exposed between the features and the gap fill insulating regions. The bottom end of each carbon film sidewall 118A contacts the upper surface (i.e., the p+ region 116 for example) of the diode 110. The adhesion layer 206A is located between the carbon sidewalls and the planarized gap fill dielectric regions.

Figure 8J:
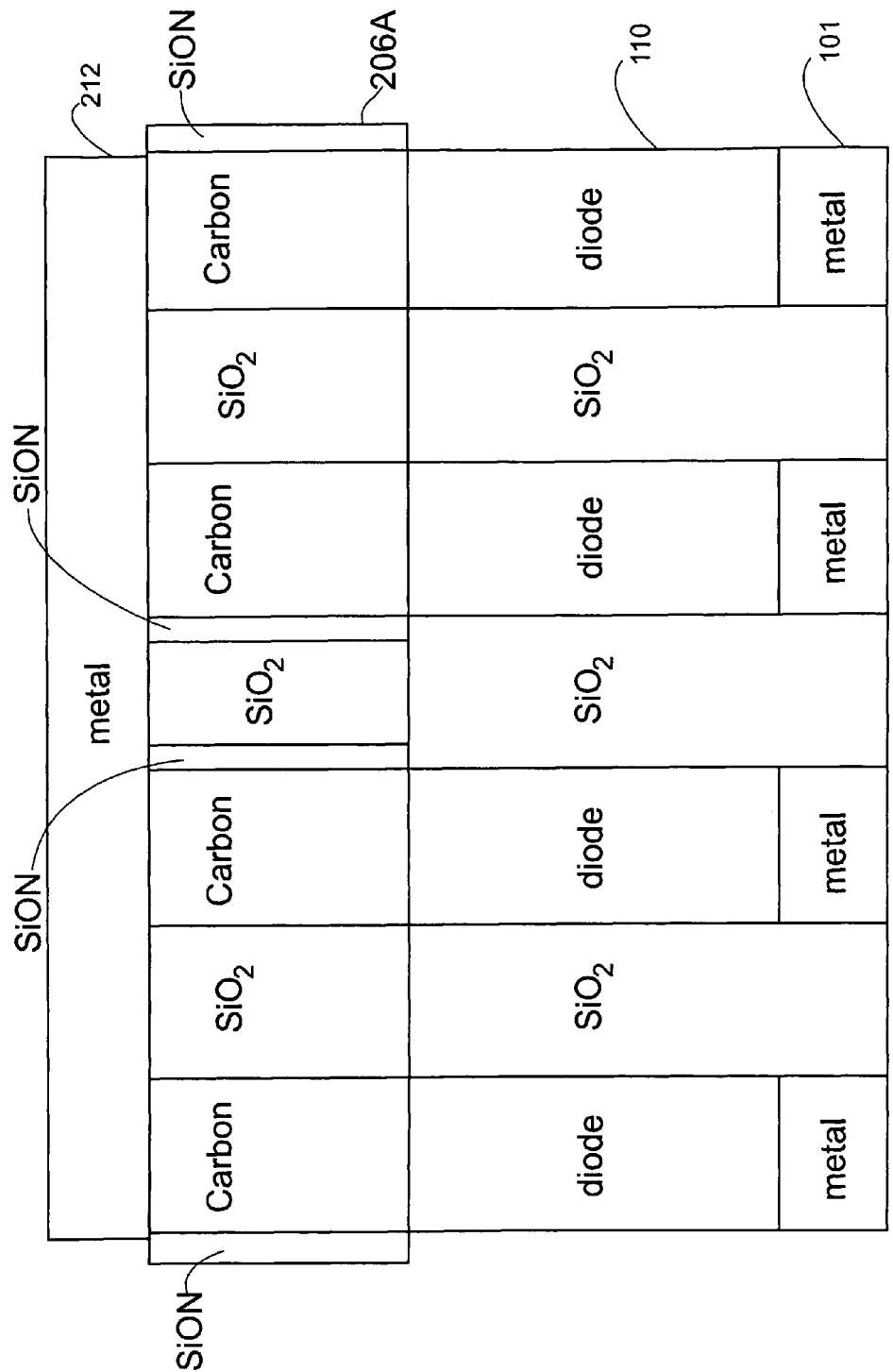
Figure 8K:
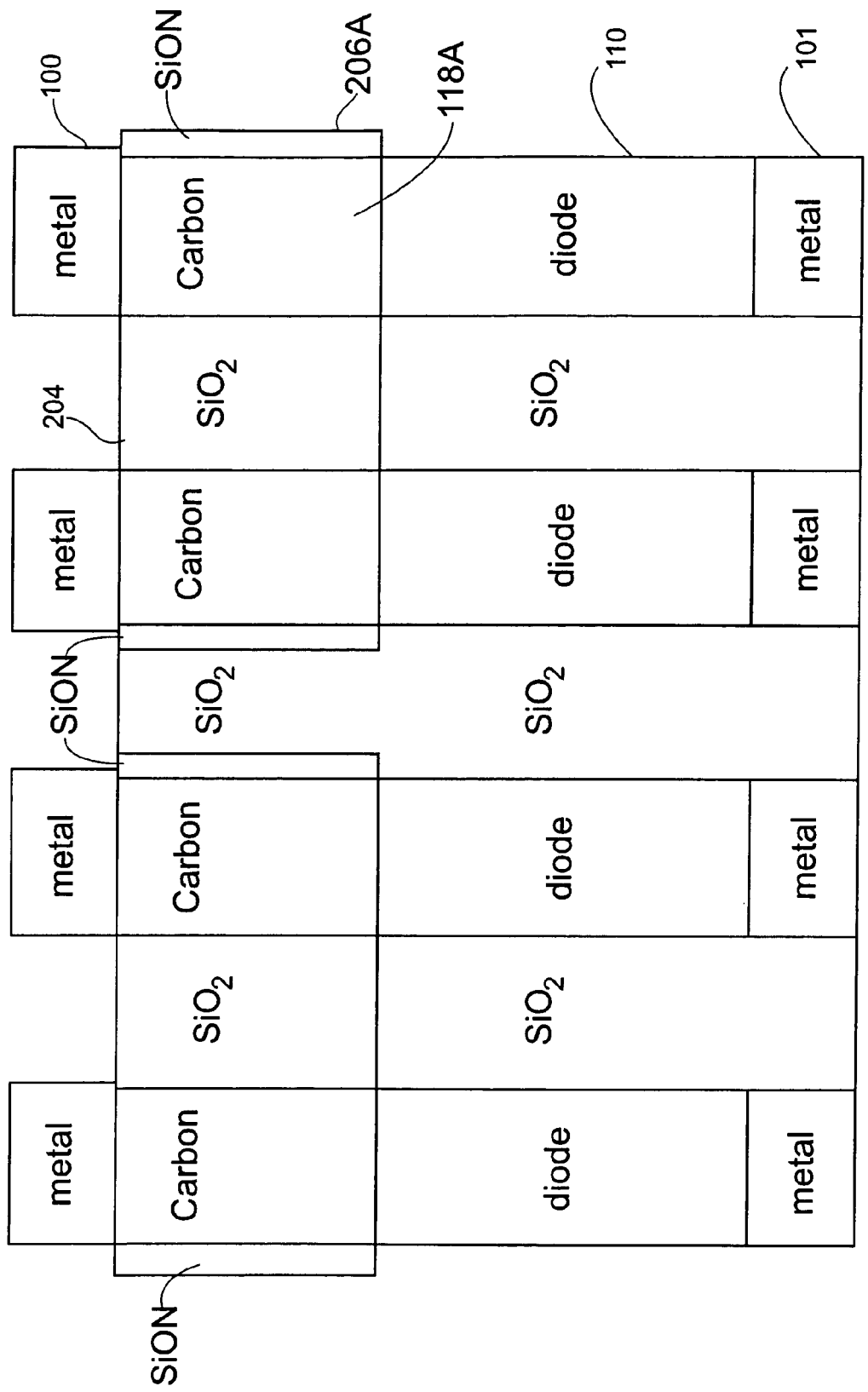

As shown in FIG. 8J, the upper conductive layer 212 is then deposited over the structure. This conductive layer is then patterned into rail shaped upper electrodes 100 which electrically contact the exposed upper portions of the carbon sidewalls 118A, as shown in FIG. 8K. As noted above, the film 118A may be located below the diodes 110 in an alternative configuration. Furthermore, additional layers may be inserted between the above described elements. However, if these intervening layers are conductive, then the above described are still electrically connected to each other.

In an alternative method, rather than depositing and patterning the semiconductor layers to form the diode, as described above, the semiconductor material is formed in openings in an insulating layer. This can be performed by either selectively depositing the semiconductor material into openings in the insulating layer or the semiconductor material is non-selectively deposited into openings in the insulating layer and over the upper surface of the insulating layer and then planarized, as described in U.S. application Ser. No. 12/007,780 and U.S. application Ser. No. 12/007,781, both filed on Jan. 15, 2008, which are hereby incorporated by reference in their entirety. The carbon film 118 may also be deposited into the openings in the insulating layer, such that the film 118 forms a sidewall spacer on a portion of the sidewall of the opening, followed by the planarization step. In this case, the features may be omitted. Likewise, the upper electrodes 100 may also be formed in the openings by a damascene process.

The above described memory arrays shown in FIGS. 2B-2E may be located in a one memory level device. If desired, additional memory levels can be formed above the first memory level to form a monolithic three dimensional memory array. In some embodiments, conductors can be shared between memory levels; i.e. top conductor 100 shown in FIG. 2A would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

While the storage element (such as the resistivity switching material 118) has been described as a carbon material above, it may comprise other materials, such as an antifuse dielectric, a fuse, a polysilicon memory effect material, a metal oxide or switchable complex metal oxide material, a phase change material, a conductive bridge element, an electrolyte switching material, or a switchable polymer material.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of programming a nonvolatile memory cell comprising a steering element located in series with a storage element, wherein the storage element comprises a carbon material, the method comprising applying at least one initialization pulse having a duration of at least 1 ms, followed by applying plural programming pulses having a duration of less than 1 ms;

wherein the step applying the plural programming pulses comprises:
applying a reset pulse to change a resistivity state of the carbon material from a first state to a second state; and
applying a first set pulse to change a resistivity state of the carbon material from a second state to a third state;
applying a second set pulse to change a resistivity state of the carbon material from the third state to a fourth state; and
applying a third set pulse to change a resistivity state of the carbon material from the fourth state to the first state;

further comprising performing a second programming cycle comprising:
applying the reset pulse to change a resistivity state of the carbon material from the first state to the second state;
applying the first set pulse to change a resistivity state of the carbon material from the second state to the third state;
applying the second set pulse to change a resistivity state of the carbon material from the third state to the fourth state; and
applying the third set pulse to change a resistivity state of the carbon material from the fourth state to the first state.

2. The method of claim 1, further comprising performing at least fifty programming cycles.

3. The method of claim 2, further comprising re-applying the initialization pulse after a predetermined number of programming cycles.

4. The method of claim 2, further comprising limiting a current provided to the memory cell during the step of applying the reset pulse such that the initialization pulse is not applied during the at least fifty programming cycles.

5. The method of claim 1, wherein:
the reset pulse and the first, second and third set pulses comprise forward bias pulses; and
the reset pulse has a larger amplitude than the first, second and third set pulses.

6. The method of claim 1, wherein the initialization pulse has a voltage amplitude of 10 to 20V, the reset pulse has a voltage amplitude of 10 to 20V and the first, second and third pulses have a different voltage amplitude ranging from 6 to 10V.

7. The method of claim 1, wherein memory cell comprises a portion of a monolithic three dimensional array of nonvolatile memory cells.

8. The method of claim 1, wherein the steering element comprises a diode or a transistor and the carbon material comprises at least one of carbon nanotube, amorphous carbon, polycrystalline carbon or graphene resistivity switching material.

9. The method of claim 8, wherein the carbon material comprises the polycrystalline carbon having a first Raman spectrum peak between 1300 and 1350 $cm^{-1}$ and a second Raman spectrum peak between 1600 and 1650 $cm^{-1}$.

10. The method of claim 9, wherein the steering element comprises the diode.

11. The method of claim 1, wherein the plural programming pulses comprise at least one of a stepped pulse amplitude or a stepped pulse width.

12. A method of programming a nonvolatile memory cell comprising a diode steering element located in series with a polycrystalline carbon material storage element, the method comprising:

applying at least one initialization pulse having a duration of at least 1 ms, followed by applying plural programming pulses having a duration of less than 1 ms;

wherein the step applying the plural programming pulses comprises:

applying a reset pulse to change a resistivity state of the carbon material from a first state to a second state;

applying a first set pulse to change a resistivity state of the carbon material from a second state to a third state;

applying a second set pulse to change a resistivity state of the carbon material from the third state to a fourth state; and applying a third set pulse to change a resistivity state of the carbon material from the fourth state to the first state.

13. The method of claim 12, further comprising performing a second programming cycle comprising:

applying the reset pulse to change a resistivity state of the carbon material from the first state to the second state;

applying the first set pulse to change a resistivity state of the carbon material from the second state to the third state;

applying the second set pulse to change a resistivity state of the carbon material from the third state to the fourth state; and applying the third set pulse to change a resistivity state of the carbon material from the fourth state to the first state.

* * * * *